US010681842B1

(12) United States Patent
Hart et al.

(10) Patent No.: US 10,681,842 B1
(45) Date of Patent: Jun. 9, 2020

(54) MONOLITHIC SIGNAL CARRIER DEVICE IMPLEMENTED IN CRYOGENIC QUANTUM COMPUTING APPLICATIONS

(71) Applicant: International Business Machines Corporation, Armonk, NY (US)

(72) Inventors: Sean Hart, Tarrytown, NY (US); Nicholas Torleiv Bronn, Long Island City, NY (US); Patryk Gumann, Tarrytown, NY (US); Salvatore Bernardo Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/287,489

(22) Filed: Feb. 27, 2019

(51) Int. Cl.
*H05K 7/20* (2006.01)
*G06N 10/00* (2019.01)

(52) U.S. Cl.
CPC ......... *H05K 7/20372* (2013.01); *G06N 10/00* (2019.01); *H05K 7/205* (2013.01); *H05K 7/20436* (2013.01)

(58) Field of Classification Search
CPC ........... H05K 7/20372; H05K 7/20436; H05K 7/205; G06N 10/00
USPC ...................................................... 174/15.1
See application file for complete search history.

(56) References Cited

U.S. PATENT DOCUMENTS

| 5,135,556 A | 8/1992 | Hornback et al. |
| 5,459,284 A | 10/1995 | Bockelman et al. |
| 5,471,010 A | 11/1995 | Bockelman et al. |
| 7,400,222 B2 | 7/2008 | Kwon et al. |
| 7,667,321 B2 | 2/2010 | Rebelo et al. |
| 7,863,716 B2 | 1/2011 | Ali et al. |
| 8,115,509 B2 | 2/2012 | Takada |
| 8,159,313 B2 | 4/2012 | Uchaykin |
| 8,315,678 B2 | 11/2012 | Uchaykin |
| 8,441,329 B2 | 5/2013 | Thom et al. |
| 8,558,398 B1 | 10/2013 | Seetharam |
| 9,024,417 B2 | 5/2015 | Rollin et al. |

(Continued)

FOREIGN PATENT DOCUMENTS

| CN | 201802588 U | 4/2011 |
| CN | 201803392 U | 4/2011 |

(Continued)

OTHER PUBLICATIONS https://www.bluefors.com/index.php/xld-series, Last accessed Feb. 26, 2019, 14 Pages.
George, et al, Multiplexing Superconducting Qubit Circuit for Single Microwave Photon Generation, J Low Temp Phys, Jul. 5, 2017, pp. 60-75, vol. 189.
Krinner, et. al., Engineering cryogenic setups for 100-qubit scale superconducting circuit systems, Jun. 20, 2018, 31 Pages.

(Continued)

*Primary Examiner* — Sherman Ng
(74) *Attorney, Agent, or Firm* — Amin, Turocy & Watson, LLP

(57) ABSTRACT

Devices, systems, methods, and computer-implemented methods to facilitate transmitting microwave signals to one or more cryogenic stages of a cryogenic refrigerator are provided. According to an embodiment, a device can comprise a monolithic signal carrier device comprising a thermal barrier disposed within a ground layer and a signal layer. The device can further comprise a thermal decoupling device coupled at the thermal barrier to the ground layer and the signal layer.

20 Claims, 14 Drawing Sheets

(56) References Cited

U.S. PATENT DOCUMENTS

| | | | |
|---|---|---|---|
| 9,520,547 | B2 | 12/2016 | Abraham et al. |
| 9,520,853 | B2 * | 12/2016 | Laighton ................. H01P 1/227 |
| 9,647,662 | B1 | 5/2017 | Abutaleb et al. |
| 9,826,622 | B2 | 11/2017 | Kuemmeth et al. |
| 10,043,136 | B1 | 8/2018 | Abdo |
| 2002/0118528 | A1 | 8/2002 | Su et al. |
| 2006/0043587 | A1 | 3/2006 | Lim et al. |
| 2006/0065983 | A1 | 3/2006 | Chia et al. |
| 2016/0292587 | A1 | 10/2016 | Rigetti et al. |
| 2017/0257074 | A1 * | 9/2017 | Yeh ........................ G06N 99/00 |
| 2018/0102470 | A1 | 4/2018 | Das et al. |
| 2018/0294401 | A1 | 10/2018 | Tuckerman |

FOREIGN PATENT DOCUMENTS

| | | |
|---|---|---|
| JP | S63-288034 A | 11/1988 |
| WO | 2009086430 A2 | 9/2009 |

OTHER PUBLICATIONS https://nanoscience.oxinst.com/products/cryofree-dilution-refrigerators/tritonxl, Last accessed Feb. 27, 2019, 8 Pages.

Mariantoni et al., Photon shell game in three-resonator circuit quantum electrodynamics, Nature Physics, Jan. 2011, vol. 7, pp. 287-293, Macmillan Publishers Limited, 7 pages.

Bronn et al., High Coherence Plane Breaking Packaging for Superconducting Qubits, Feb. 14, 2018, arXiv:1709.02402v2 [quant-ph], 9 pages.

International Search Report and Written Opinion received for PCT Application Serial No. PCT/EP2019/074333 dated Dec. 6, 2019, 16 pages.

Colless et al., "Modular Cryogenic Interconnects for Multi-Qubit Devices", arxiv. org, May 14, 2014, 6 pages.

Colless et al., "Cryogenic High-Frequency Readout and Control Platform for Spin Quibts", XP012161865, vol. 83, No. 2, Feb. 1, 2012, 7 pages.

* cited by examiner

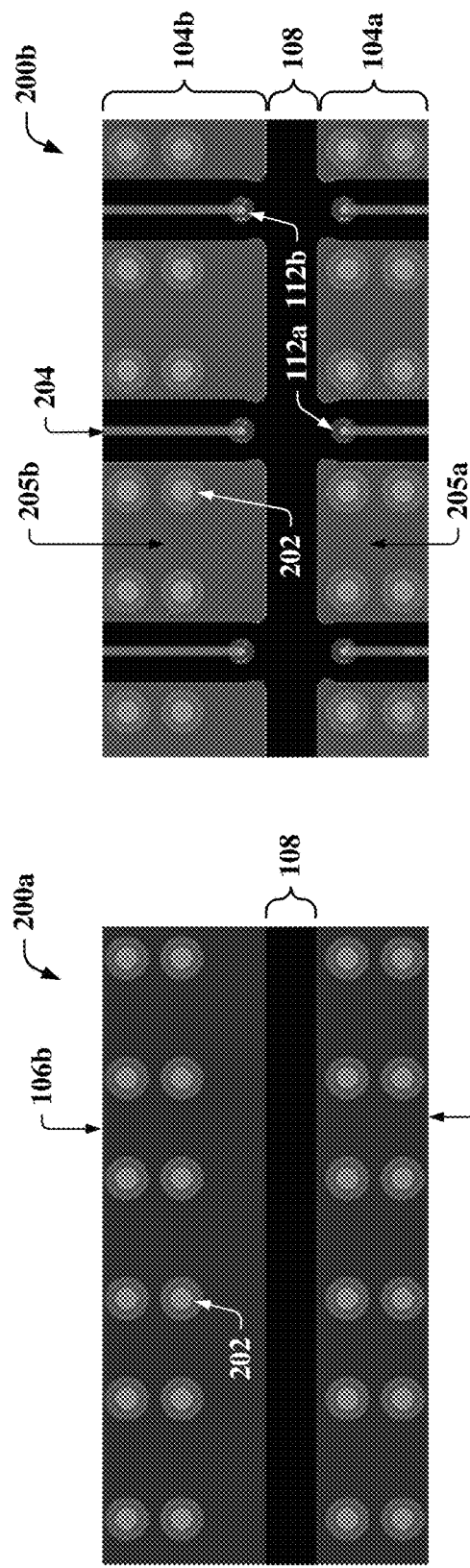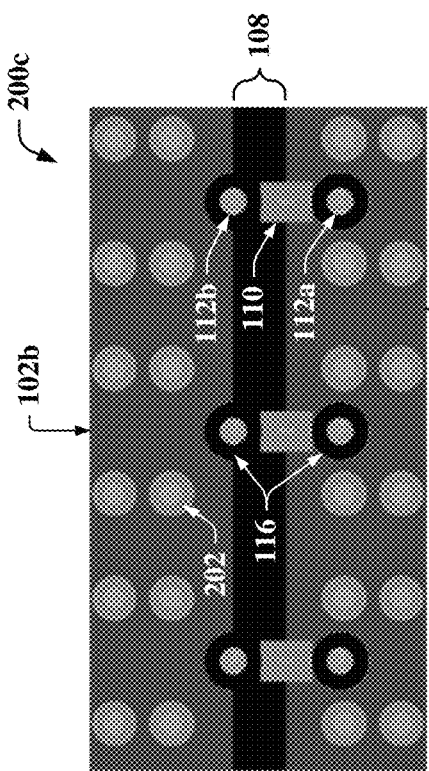
FIG. 2A
FIG. 2B
FIG. 2C

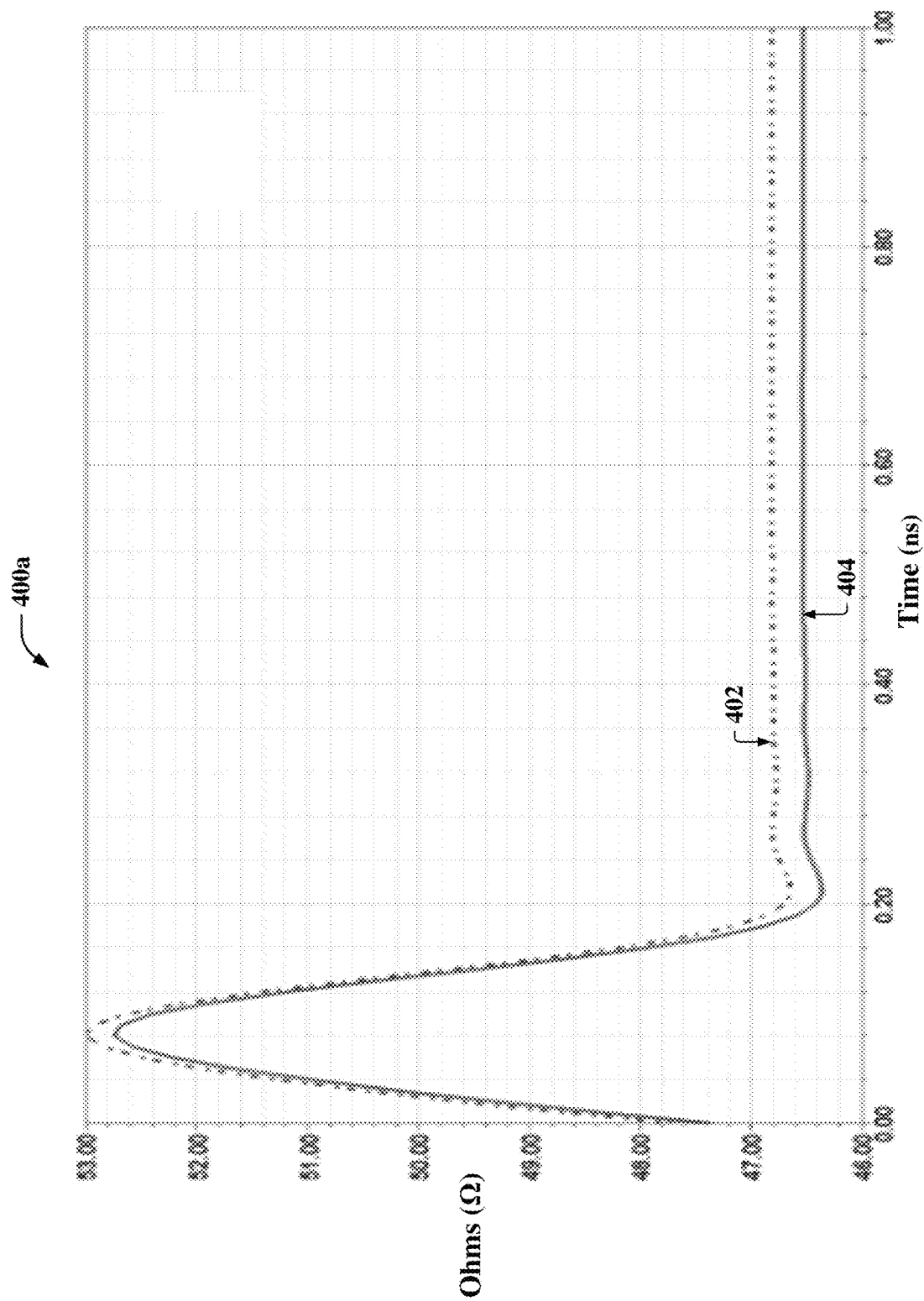

MONOLITHIC SIGNAL CARRIER DEVICE IMPLEMENTED IN CRYOGENIC QUANTUM COMPUTING APPLICATIONS

BACKGROUND

The subject disclosure relates to signal carrier devices, and more specifically, to a monolithic signal carrier device that can facilitate transmitting microwave signals to a quantum computing device in a cryogenic refrigerator. Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits (qubits), and use interference.

Universal quantum computers (e.g., quantum computing hardware) require many physical qubits (e.g., millions) and error correction schemes require access to all such qubits (e.g., microwave signal transmission to all such qubits). A problem with current state-of-the-art systems is that access to one or more stages (e.g., a mixing chamber stage) of a cryogenic refrigerator (e.g., a dilution refrigerator) is limited to the number of connectors that can physically fit through cryogenic plates that define the stages of the cryogenic refrigerator. Existing systems are limited to approximately 200 ports for input and output, and thus, such systems can only facilitate transmission of approximately 100 independent microwave signals to and from quantum computing hardware (e.g., to 100 qubits). Another problem with current state-of-the-art systems is that they require several connection components at and/or between each cryogenic plate to ensure thermal isolation of such components in each stage of the cryogenic refrigerator. For example, such existing systems require several bulkheads (e.g., subminiature version A (SMA) bulkheads), attenuators, and coaxial cables for each port that accesses a quantum computing device at the mixing chamber stage of a cryogenic refrigerator.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, and/or computer-implemented methods that can facilitate transmitting microwave signals to one or more cryogenic stages of a cryogenic refrigerator are described.

According to an embodiment, a device can comprise a monolithic signal carrier device comprising a thermal barrier disposed within a ground layer and a signal layer. The device can further comprise a thermal decoupling device coupled at the thermal barrier to the ground layer and the signal layer. An advantage of the device is that it can provide a large quantity (e.g., approximately 1,000 or more) of independent microwave signal transmission paths (e.g., stripline microwave transmission lines) that can be utilized to transmit independent microwave signals to respective quantum computing devices and/or qubits in a mixing chamber stage of a cryogenic refrigerator.

In an embodiment, the device can further comprise a heat sink coupled to the ground layer and a cryogenic plate of a cryogenic refrigerator, where the heat sink thermalizes the ground layer and the cryogenic plate. In this embodiment, the heat sink can comprise a flexible heat sink. An advantage of such a device is that it can allow the device, as well as the cryogenic plate to expand and contract independently due to varying temperatures of each cryogenic stage of the cryogenic refrigerator.

According to an embodiment, a method can comprise forming a ground layer and a signal layer in a monolithic signal carrier device. The method can further comprise forming a thermal barrier within the ground layer and the signal layer. The method can also comprise coupling a thermal decoupling device at the thermal barrier to the ground layer and the signal layer. An advantage of such a method is that it can be implemented to fabricate a device comprising a large quantity (e.g., approximately 1,000 or more) of independent microwave signal transmission paths (e.g., stripline microwave transmission lines) that can be utilized to transmit independent microwave signals to respective quantum computing devices and/or qubits at the mixing chamber stage of a cryogenic refrigerator.

In an embodiment, the method can further comprise coupling a heat sink to the ground layer and a cryogenic plate of a cryogenic refrigerator. An advantage of the method is that it can be implemented to allow the device, as well as the cryogenic plate to expand and contract independently due to varying temperatures of each cryogenic stage of the cryogenic refrigerator.

According to another embodiment, a device can comprise a monolithic signal carrier device comprising thermal barriers disposed within a ground layer and a signal layer. The device can further comprise thermal decoupling devices coupled at the thermal barriers to the ground layer and the signal layer. The device can also comprise a shield coupled to the ground layer. An advantage of the device is that it can provide a large quantity (e.g., approximately 1,000 or more) of independent microwave signal transmission paths (e.g., stripline microwave transmission lines) that can be utilized to transmit independent microwave signals to respective quantum computing devices and/or qubits in a mixing chamber stage of a cryogenic refrigerator. Another advantage of the device is that the shield can reduce crosstalk between the independent microwave signal transmission paths.

In an embodiment, the device can further comprise heat sinks coupled to the ground layer and cryogenic plates of a cryogenic refrigerator, where the heat sinks thermally couple the ground layer to the cryogenic plates, and where the thermal barriers separate sections of the ground layer that are thermally coupled to different cryogenic plates. An advantage of such a device is that it can allow the monolithic signal carrier device, as well as the cryogenic plates to expand and contract independently due to varying temperatures of each cryogenic stage of the cryogenic refrigerator.

According to another embodiment, a system can comprise a cryogenic refrigerator comprising cryogenic plates that separate cryogenic stages. The system can further comprise a monolithic signal carrier device coupled to the cryogenic plates that transmits microwave signals across the cryogenic stages to a mixing chamber stage of the cryogenic refrigerator. An advantage of the system is that the monolithic signal carrier device can provide a large quantity (e.g., approximately 1,000 or more) of independent microwave signal transmission paths (e.g., stripline microwave transmission lines) that can be utilized to transmit independent microwave signals to respective quantum computing devices and/or qubits in the mixing chamber stage of the cryogenic refrigerator.

In an embodiment, the ground layer can be coupled to the cryogenic plates by heat sinks that thermally couple the ground layer to the cryogenic plates, where the thermal barriers separate sections of the ground layer that are thermally coupled to the cryogenic plates. An advantage of such a system is that it can allow the monolithic signal carrier device, as well as the cryogenic plate to expand and contract independently due to varying temperatures of each cryogenic stage of the cryogenic refrigerator.

According to another embodiment, a method can comprise coupling a monolithic signal carrier device to one or more cryogenic plates of a cryogenic refrigerator. The method can further comprise transmitting microwave signals through the monolithic signal carrier device to one or more cryogenic stages of the cryogenic refrigerator. An advantage of such a method is that it can be implemented to transmit a large quantity (e.g., approximately 1,000 or more) of independent microwave signals to respective quantum computing devices and/or qubits in a mixing chamber stage of a cryogenic refrigerator.

In an embodiment, the method can further comprise thermalizing a ground layer of the monolithic signal carrier device and the one or more cryogenic plates. The method can also comprise thermalizing the ground layer and a signal layer of the monolithic signal carrier device. An advantage of such a method is that it can be implemented to transmit a large quantity (e.g., approximately 1,000 or more) of independent microwave signals to respective quantum computing devices and/or qubits in a mixing chamber stage of a cryogenic refrigerator.

DESCRIPTION OF THE DRAWINGS

FIGS. 2A, 2B, and 2C illustrate top views of layers in an example, non-limiting device that can facilitate transmitting microwave signals to one or more cryogenic stages of a cryogenic refrigerator in accordance with one or more embodiments described herein.

FIGS. 4A and 4B illustrate example, non-limiting graphs that can represent data of microwave signals transmitted in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Given the above problem with access to one or more stages (e.g., a mixing chamber stage) of a cryogenic refrigerator being limited by the number of connectors that can physically fit through cryogenic plates defining the stages of the cryogenic refrigerator, the present disclosure can be implemented to produce a solution to this problem in the form of devices, systems, methods, and/or computer-implemented methods that can facilitate transmitting microwave signals to one or more cryogenic stages of a cryogenic refrigerator. An advantage of such devices, systems, methods, and/or computer-implemented methods is that they can be employed to provide a large quantity (e.g., approximately 1,000 or more) of independent microwave signal transmission paths (e.g., stripline microwave transmission lines) that can be utilized to transmit independent microwave signals to respective quantum computing devices and/or qubits in a mixing chamber stage of a cryogenic refrigerator.

Furthermore, given the above problem with current state-of-the-art systems is that they require several connection components at and/or between each cryogenic plate to ensure thermal isolation of such components in each stage of the cryogenic refrigerator, the present disclosure can be implemented to produce a solution to this problem in the form of devices, systems, methods, and/or computer-implemented methods that facilitate transmitting microwave signals through a monolithic signal carrier device to one or more cryogenic stages of a cryogenic refrigerator. An advantage of such devices, systems, methods, and/or computer-implemented methods is that they can facilitate transmitting such microwave signals through the monolithic signal carrier device, which can extend through multiple stages of the cryogenic refrigerator without utilizing several components employed in state-of-the-art systems (e.g., subminiature version A (SMA) bulkheads, coaxial cables, etc.), thereby eliminating a need for such components.

Figure 1A:
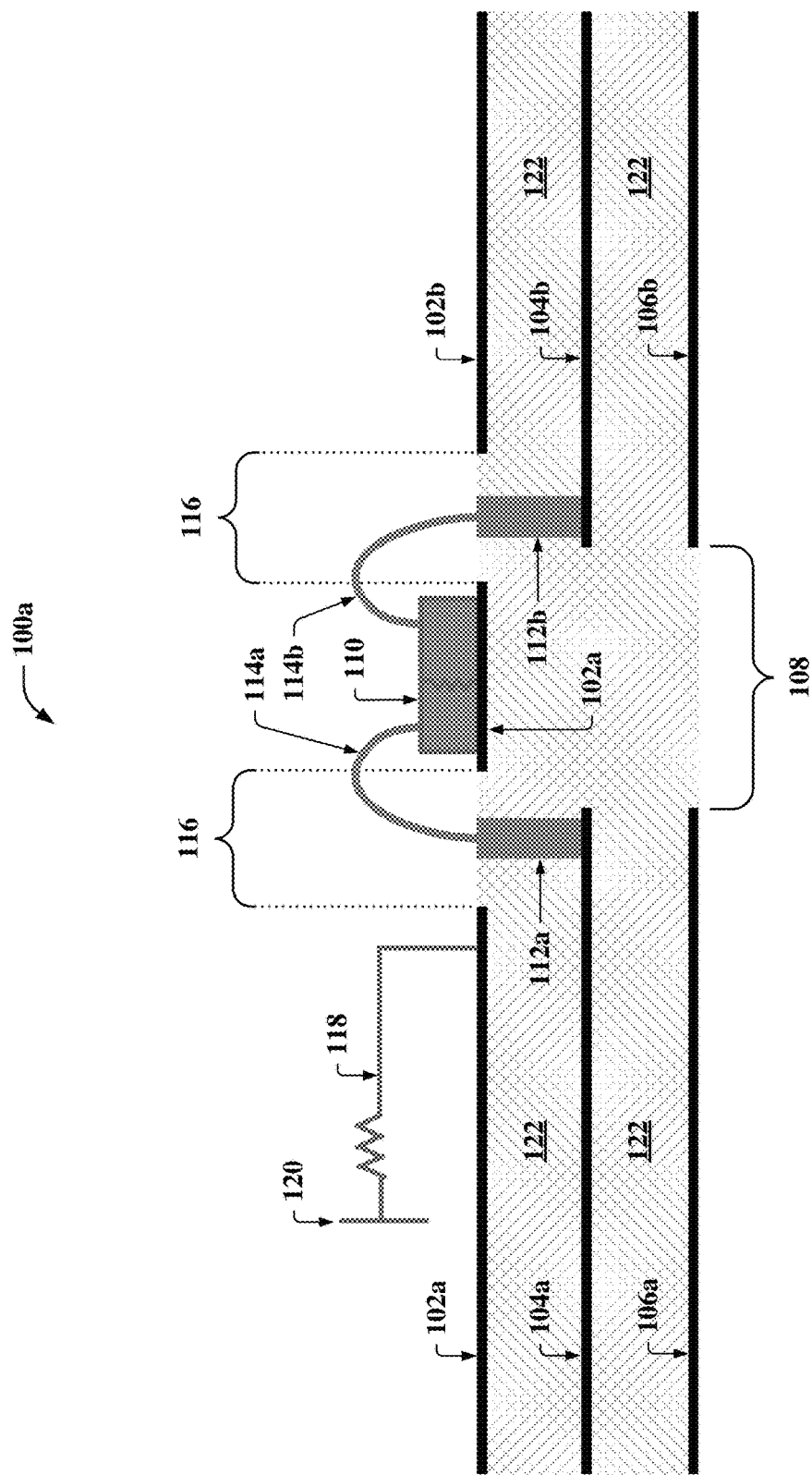
FIGS. 1A and 1B illustrate side views of example, non-limiting devices that can facilitate transmitting microwave signals to one or more cryogenic stages of a cryogenic refrigerator in accordance with one or more embodiments described herein.

FIG. 1A illustrates a side view of an example, non-limiting device 100a that can facilitate transmitting microwave signals to one or more cryogenic stages of a cryogenic refrigerator in accordance with one or more embodiments described herein. According to multiple embodiments, device 100a and/or components thereof can comprise an integrated circuit fabricated in a semiconducting device. For example, the various embodiments of device 100a and/or components thereof described herein and/or illustrated in the figures can comprise a monolithic signal carrier device that can be implemented in a cryogenic refrigerator to facilitate transmitting microwave signals to one or more cryogenic stages of the cryogenic refrigerator in accordance with one or more embodiments described herein. For instance, device 100a can comprise a monolithic signal carrier device including, but not limited to, a monolithic dielectric circuit board, a monolithic organic laminate circuit board, a monolithic printed circuit board, and/or another monolithic signal carrier device that can be implemented in a cryogenic refrigerator (e.g., a dilution refrigerator) to facilitate transmitting microwave signals to one or more cryogenic stages (e.g., a mixing chamber stage) of the cryogenic refrigerator in accordance with one or more embodiments described herein.

It should be appreciated that the embodiments of the subject disclosure depicted in various figures disclosed herein are for illustration only, and as such, the architecture of such embodiments are not limited to the systems, devices, and/or components depicted therein. For example, in some embodiments, device 100a and/or components thereof can be coupled (e.g., communicatively, electrically, mechanically, operatively, physically, thermally, etc.) to one or more external systems, devices, and/or electrical circuits, such that device 100a can facilitate transmission of microwave signals between such external systems, devices, and/or electrical circuits. For instance, device 100a and/or components thereof can be coupled to any external electronic device that can transmit microwave signals at one or more frequencies (e.g., single-tone, multi-tone) and/or receive microwave signals at such one or more frequencies. In this example, such an external electronic device can comprise a vector network analyzer (VNA) that can transmit, via device 100a, microwave signals at a single frequency or at multiple frequencies to a quantum computing device (e.g., a quantum computer, quantum processor, quantum hardware, quantum circuit, etc.) at the mixing chamber stage of a cryogenic refrigerator.

In some embodiments, fabrication of the various embodiments of device 100a and/or components thereof described herein and/or illustrated in the figures can comprise one or more multi-step sequences of, for example, photolithographic and/or chemical processing steps that facilitate gradual creation of electronic-based systems, devices, components, and/or circuits in a semiconducting device (e.g., an integrated circuit fabricated in a monolithic signal carrier device). For instance, the various embodiments of device 100a and/or components thereof described herein and/or illustrated in the figures can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), physical vapor deposition (PVD), chemical vapor deposition (CVD), atomic layer deposition (ALD), plasma enhanced chemical vapor deposition (PECVD), chemical solution deposition, electroplating, molecular beam epitaxy (MBE), electrochemical deposition (ECD), lift-off techniques, chemical-mechanical planarization (CMP), backgrinding techniques, and/or another technique for fabricating an integrated circuit in a monolithic signal carrier device (e.g., a monolithic dielectric circuit board, a monolithic organic laminate circuit board, etc.).

In some embodiments, fabrication of the various embodiments of device 100a and/or components thereof described herein and/or illustrated in the figures can be fabricated using various materials. For example, the various embodiments of device 100a and/or components thereof described herein and/or illustrated in the figures can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit in a monolithic signal carrier device.

In some embodiments, device 100a can comprise a first ground layer having multiple first ground layer sections 102a, 102b, a signal layer having multiple signal layer sections 104a, 104b, and/or a second ground layer having multiple second ground layer sections 106a, 106b. In some embodiments, first ground layer sections 102a, 102b, signal layer sections 104a, 104b, and/or second ground layer sections 106a, 106b can comprise patterned metallic layers integrated in and/or on device 100a using one or more techniques described above for fabricating an integrated circuit (e.g., photomasking, patterning, photoresist, etching, electroplating, material deposition, planarization, backgrinding, etc.). In some embodiments, first ground layer sections 102a, 102b, signal layer sections 104a, 104b, and/or second ground layer sections 106a, 106b can comprise materials including, but not limited to, copper, copper alloys (e.g., copper nickel), gold, platinum, palladium, gold alloys (e.g., gold palladium), brass, or any conductive metal or alloy.

In some embodiments, device 100a can comprise one or more thermal barriers disposed within the first ground layer, the signal layer, and/or the second ground layer. For instance, in some embodiments, device 100a can comprise a thermal barrier 108 between first ground layer sections 102a, 102b, signal layer sections 104a, 104b, and/or second ground layer sections 106a, 106b, where thermal barrier 108 can thermally separate such sections of each layer from one another. For example, thermal barrier 108 can thermally isolate: first ground layer section 102a from first ground layer section 102b; signal layer section 104a from signal layer section 104b; and/or second ground layer section 106a from second ground layer section 106b. In some embodiments, where device 100a is implemented in a cryogenic refrigerator, thermal barrier 108 can provide thermal isolation of cryogenic stages in such a cryogenic refrigerator. For example, device 100a can be coupled (e.g., via heat sink 118 as described below) to one or more cryogenic plates of a cryogenic refrigerator, where such cryogenic plates define cryogenic stages of the cryogenic refrigerator. In this example, thermal barrier 108 can thermally isolate such cryogenic stages by thermally isolating: first ground layer section 102a from first ground layer section 102b; signal layer section 104a from signal layer section 104b; and/or second ground layer section 106a from second ground layer section 106b.

In some embodiments, device 100a can comprise a thermal decoupling device 110 coupled at thermal barrier 108 to a section of the first ground layer, a first section of the signal layer, and a second section of the signal layer. For example, as illustrated in FIG. 1A, device 100a can comprise thermal decoupling device 110 coupled (e.g., electrically, mechanically, physically, thermally, etc.) at thermal barrier 108 (e.g., adjacent to thermal barrier 108) to a surface of first ground layer section 102a, signal layer section 104a, and signal layer section 104b. For instance, thermal decoupling device 110 can be epoxied to a surface (e.g., a top surface) of first ground layer section 102a, for example using silver epoxy.

In some embodiments, thermal decoupling device 110 can be coupled to signal layer sections 104a, 104b by one or more signal vias 112a, 112b and/or one or more wire bonds 114a, 114b. For example, thermal decoupling device 110 can be coupled (e.g., electrically, mechanically, physically, thermally, etc.) to signal layer section 104a by wire bond 114a and signal via 112a. In this example, wire bond 114a can couple (e.g., electrically, mechanically, physically, thermally, etc.) thermal decoupling device 110 to signal via 112a, where signal via 112a can be coupled (e.g., electrically, mechanically, physically, thermally, etc.) to signal layer section 104a (e.g., as depicted in FIG. 1A). In another example, thermal decoupling device 110 can be coupled (e.g., electrically, mechanically, physically, thermally, etc.) to signal layer section 104b by wire bond 114b and signal via 112b. In this example, wire bond 114b can couple (e.g., electrically, mechanically, physically, thermally, etc.) thermal decoupling device 110 to signal via 112b, where signal via 112b can be coupled (e.g., electrically, mechanically, physically, thermally, etc.) to signal layer section 104b (e.g., as depicted in FIG. 1A).

In some embodiments, thermal decoupling device 110 can comprise any thermal decoupling device that can be positioned between signal via 112a and signal via 112b to enable the transition. For example, thermal decoupling device 110 can a thermal decoupling device including, but not limited to, an attenuator, a low noise amplifier, a filter, a transmission line, and/or another thermal decoupling device.

In some embodiments, signal vias 112a, 112b and/or wire bonds 114a, 114b can be formed using one or more techniques described above for fabricating an integrated circuit (e.g., photomasking, patterning, photoresist, etching, electroplating, material deposition, planarization, backgrinding, wire bonding, etc.). In some embodiments, signal vias 112a, 112b and/or wire bonds 114a, 114b can be fabricated using materials including, but not limited to, copper, copper alloys (e.g., copper nickel), gold, platinum, palladium, gold alloys (e.g., gold palladium), brass, aluminum, or any conductive metal or alloy.

In some embodiments, device 100a can comprise isolation sections 116 formed in first ground layer sections 102a, 102b. In these embodiments, such isolation sections 116 can provide isolation (e.g., electrical, thermal, etc.) of signal vias 112a, 112b from first ground layer sections 102a, 102b. For example, as illustrated in FIGS. 1A and 2C, device 100a can comprise isolation sections 116 formed in first ground layer sections 102a, 102b such that isolation sections 116 prevent signal vias 112a, 112b from coupling (e.g., electrically, mechanically, physically, thermally, etc.) with first ground layer sections 102a, 102b. In this example, isolation sections 116 can thereby prevent a short circuit (e.g., electrical short circuit, thermal short circuit, etc.) between first ground layer sections 102a, 102b and signal layer sections 104a, 104b. In some embodiments, for example, as illustrated in FIGS. 1A and 2C, isolation sections 116 can be formed in first ground layer sections 102a, 102b such that isolation sections 116 overlap thermal barrier 108. In some embodiments, for example as illustrated in FIG. 2C, isolation sections 116 can be formed in first ground layer section 102a such that thermal decoupling device 110 remains coupled directly to ground layer section 102a.

In some embodiments, device 100a can comprise a heat sink 118 coupled to first ground layer section 102a. For example, device 100a can comprise heat sink 118 coupled (e.g., electrically, mechanically, physically, thermally, etc.) to first ground layer section 102a as depicted in FIG. 1A. In some embodiments, heat sink 118 can comprise a flexible heat sink that enables movement of device 100a caused by thermal contraction and/or expansion. In some embodiments, heat sink 118 can comprise a thermally conductive heat sink and/or an electrically conductive heat sink. In some embodiments, heat sink 118 can be fabricated using materials including, but not limited to, copper, gold, gold-plated copper, and/or another material.

In some embodiments, heat sink 118 can be coupled to first ground layer section 102a and a cryogenic plate 120 of a cryogenic refrigerator (not illustrated in FIG. 1A). For example, heat sink 118 can be coupled (e.g., electrically, mechanically, physically, thermally, etc.) to first ground layer section 102a and cryogenic plate 120 as depicted in FIG. 1A. In this example, heat sink 118 can thermalize first ground layer section 102a and cryogenic plate 120. For instance, based on heat sink 118 being coupled to first ground layer section 102a and cryogenic plate 120 as described above, heat sink 118 can cause the temperature of first ground layer section 102a and the temperature of cryogenic plate 120 to be equal (e.g., such components can be in thermal equilibrium). In some embodiments, cryogenic plate 120 can comprise International Organization for Standardization (ISO) 100 plates. In some embodiments, cryogenic plate 120 can comprise one of the plates of a dilution refrigerator, for example, the mixing chamber plate.

In some embodiments, thermal decoupling device 110 can thermalize first ground layer section 102a, signal layer section 104a, and signal layer section 104b. For example, based on thermal decoupling device 110 being coupled to first ground layer section 102a, signal layer section 104a, and signal layer section 104b as described above, thermal decoupling device 110 can cause the temperature of first ground layer section 102a, as well as the temperature of signal layer section 104a and signal layer section 104b to be equal (e.g., such components can be in thermal equilibrium). In some embodiments, based on heat sink 118 being coupled to cryogenic plate 120 and first ground layer section 102a (e.g., as described above), and thermal decoupling device 110 being coupled to first ground layer section 102a and signal layer sections 104a, 104b (e.g., as described above), the temperature of cryogenic plate 120 and signal layer section 104b can be equal (e.g., such components can be in thermal equilibrium).

In some embodiments, device 100a can comprise material 122 between the first ground layer and the signal layer and between the signal layer and the second ground layer. For example, as depicted in FIG. 1A, device 100a can comprise material 122 between first ground layer sections 102a, 102b and signal layer sections 104a, 104b and between signal layer sections 104a, 104b and second ground layer sections 106a, 106b. In some embodiments, material 122 can comprise a material including, but not limited to, dielectric material, organic laminate material, silicon, glass-reinforced epoxy laminate material, ceramics, fire retardant material (e.g., fire retardant 4 (FR-4)), polymers (e.g., polytetrafluoroethylene), and/or another material. In some embodiments, material 122 can comprise thermal barrier 108 and/or isolation sections 116. For example, thermal barrier 108 and/or isolation sections 116 can be sections of material 122 that function as described above (e.g., thermal isolation, electrical isolation, etc.), where thermal barrier 108, isolation sections 116, and material 122 are fabricated using the same material.

In some embodiments, first ground layer sections 102a, 102b can be coupled to second ground layer sections 106a, 106b. For example, first ground layer sections 102a, 102b can be coupled (e.g., electrically, thermally, etc.) to second ground layer sections 106a, 106b by vias (e.g., ground vias 202 depicted in FIGS. 2A, 2B, 2C, 3, and 5) that can extend through signal layer sections 104a, 104b. In this example, such vias (e.g., ground vias 202) can be coupled (e.g., electrically, mechanically, physically, thermally, etc.) to first ground layer sections 102a, 102b and second ground layer sections 106a, 106b, thereby coupling (e.g., electrically, thermally, etc.) first ground layer sections 102a, 102b to second ground layer sections 106a, 106b.

In some embodiments, device 100a and/or components thereof can comprise any dimensions that can facilitate transmitting microwave signals to one or more cryogenic stages of a cryogenic refrigerator in accordance with one or more embodiments described herein. In a non-limiting, example embodiment (e.g., where device 100a comprises a printed circuit board fabricated using a dielectric material), device 100a can comprise a width ranging from approximately 1 inch to approximately 24 inches, a length of approximately 36 inches, and/or a thickness of approximately 5 mil to approximately 400 mil (e.g., where 1 mil is equivalent to $1/1000^{th}$ of an inch). In this example, first ground layer sections 102a, 102b, signal layer sections 104a, 104b, and/or second ground layer sections 106a, 106b can comprise a thickness of 1.2 mil. In this example, thermal barrier 108 can comprise a length which is determined by the length of thermal decoupling device 110 and minimizes the lengths of wirebonds 114a and 114b. In this example, material 122 can comprise a thickness ranging from approximately 5 mil to approximately 30 mil between first ground layer sections 102a, 102b, signal layer sections 104a, 104b, and/or second ground layer sections 106a, 106b. In this example, such dimensions can facilitate specifying the impedance of the microwave transmission line to match that of the input and output coaxial lines (e.g., 50 Ohms in this case).

In another non-limiting, example embodiment (e.g., where device 100a comprises an organic laminate fabricated using a dielectric material), first ground layer sections 102a, 102b, signal layer sections 104a, 104b, and/or second ground layer sections 106a, 106b can comprise a thickness of 15 micrometers (μm). In this example, thermal barrier 108 can comprise a length which is determined by the length of thermal decoupling device 110, and minimizes the lengths of wirebonds 114a and 114b. In this example, material 122 can comprise a thickness of 33 μm between first ground layer sections 102a, 102b, signal layer sections 104a, 104b, and/or second ground layer sections 106a, 106b. In this example, such dimensions can facilitate specifying the impedance of the microwave transmission line to match that of the input and output coaxial lines (e.g., 50 Ohms in this case).

Figure 1B:
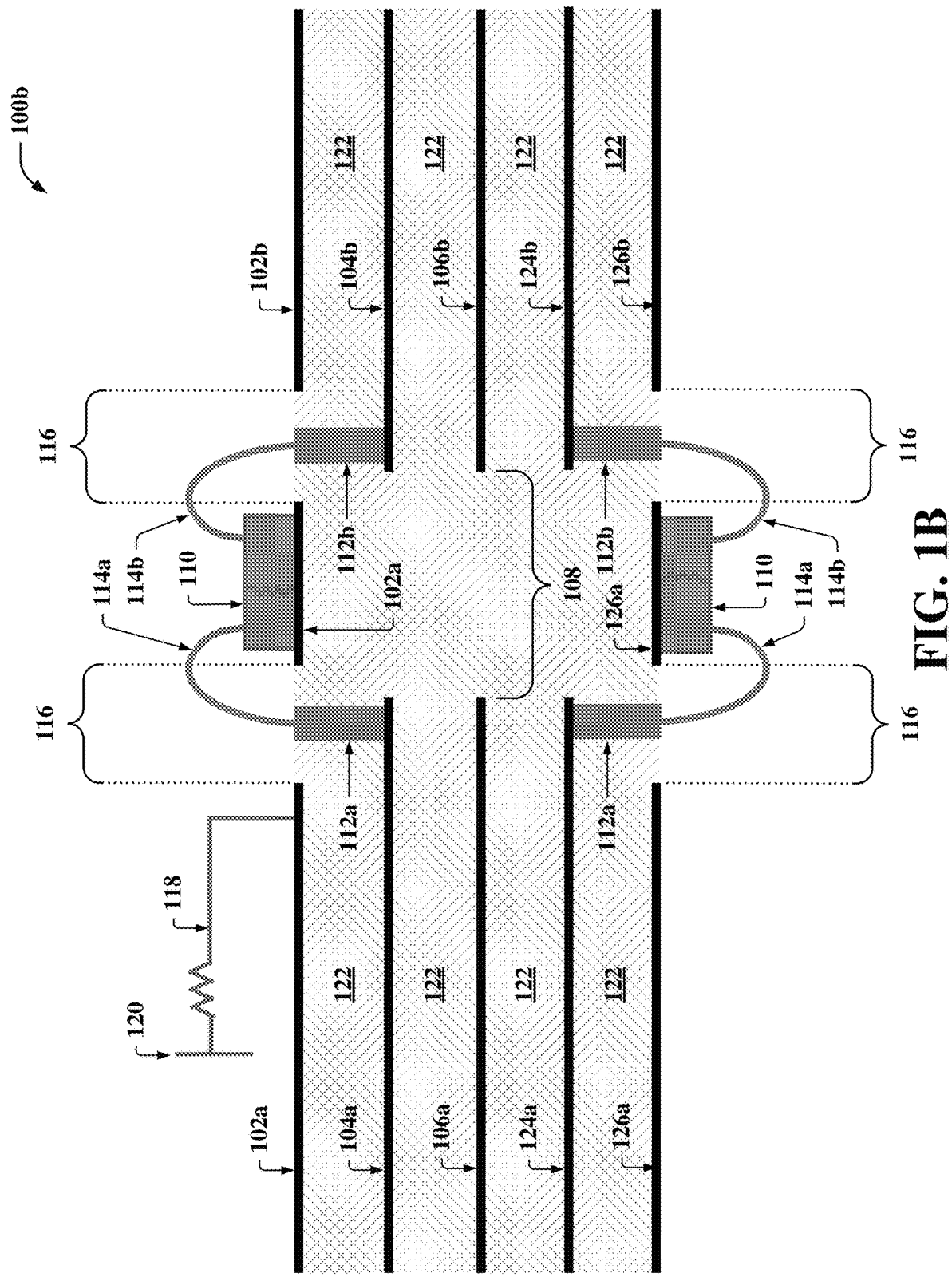

FIG. 1B illustrates a side view of an example, non-limiting device 100b that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

In some embodiments, device 100b can comprise an example, non-limiting alternative embodiment of device 100a, where device 100b can comprise a second signal layer having multiple second signal layer sections 124a, 124b and/or a third ground layer having multiple third ground layer sections 126a, 126b. In some embodiments, second signal layer sections 124a, 124b can comprise signal layer sections 104a, 104b. In some embodiments, third ground layer sections 126a, 126b can comprise first ground layer sections 102a, 102b and/or second ground layer sections 106a, 106b. In some embodiments, device 100b can comprise one or more thermal decoupling devices 110, where at least one of such thermal decoupling devices 110 can be coupled to second signal layer sections 124a, 124b and/or third ground layer section 126a in the same manner thermal decoupling device 110 of device 100a can be coupled to first ground layer section 102a and/or signal layer sections 104a, 104b as described above with reference to FIG. 1 (e.g., by one or more signal vias 112a, 112b, one or more wire bonds 114a, 114b, etc.).

FIGS. 2A, 2B, and 2C illustrate top views of layers 200a, 200b, 200c in an example, non-limiting device that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

In some embodiments, layer 200a (FIG. 2A) can comprise a top view of an example, non-limiting alternative embodiment of second ground layer sections 106a, 106b of device 100a, where layer 200a can comprise ground vias 202 that can couple second ground layer sections 106a, 106b to first ground layer sections 102a, 102b. For example, as described above with reference to device 100a and FIG. 1A, first ground layer sections 102a, 102b can be coupled (e.g., electrically, thermally, etc.) to second ground layer sections 106a, 106b by ground vias 202 that can extend through signal layer sections 104a, 104b (e.g., as depicted in FIGS. 2A, 2B, 2C, 3, and 5). In this example, ground vias 202 can be coupled (e.g., electrically, mechanically, physically, thermally, etc.) to second ground layer sections 106a, 106b and first ground layer sections 102a, 102b, thereby coupling (e.g., electrically, thermally, etc.) first ground layer sections 102a, 102b to second ground layer sections 106a, 106b to provide ground continuity. In this example, such coupling of first ground layer sections 102a, 102b to second ground layer sections 106a, 106b by ground vias 202 can also prevent one or more unwanted, spurious microwave modes and/or crosstalk. In some embodiments, ground vias 202 can be fabricated using materials including, but not limited to, copper, copper alloys (e.g., copper nickel), gold, platinum, palladium, gold alloys (e.g., gold palladium), brass, aluminum, or any conductive metal or alloy.

In some embodiments, layer 200b (FIG. 2B) can comprise a top view of an example, non-limiting alternative embodiment of signal layer sections 104a, 104b of device 100a, where signal layer sections 104a, 104b of device 200b can comprise one or more signal lines 204. In some embodiments, device 100a can comprise one or more stripline microwave transmission lines comprising signal lines 204 and/or ground planes 102a, 102b, 205a, 205b, 106a, 106b. In some embodiments, signal lines 204 can comprise electrically conductive components through which electrical current and/or electrical signals can flow. For example, signal lines 204 can comprise electrically conductive components including, but not limited to, wires, traces, transmission lines, resonant buses, waveguides, and/or other components through which electrical current (e.g., alternating current and/or direct current) and/or electrical signals (e.g., microwave frequency signals) can flow. In some embodiments, signal lines 204 can be fabricated using materials including, but not limited to, copper, copper alloys (e.g., copper nickel), gold, platinum, palladium, gold alloys (e.g., gold palladium), brass, or any conductive metal or alloy.

In some embodiments, signal lines 204 can comprise any dimensions that can facilitate transmitting microwave signals to one or more cryogenic stages of a cryogenic refrigerator in accordance with one or more embodiments described herein. In these embodiments, such dimensions can be defined such that the impedance of the stripline microwave transmission lines are matched to that of the input and output coaxial lines (i.e., 50 Ohms). In a non-limiting, example embodiment (e.g., where device 100a comprises a printed circuit board fabricated using a dielectric material), signal lines 204 can comprise a width ranging from approximately 5 mil to 20 mil (e.g., where 1 mil is equivalent to $1/1000^{th}$ of an inch). In another non-limiting, example embodiment (e.g., where device 100a comprises an organic laminate fabricated using a dielectric material), signal lines 204 can comprise a width ranging from approximately 10 μm to approximately 50 μm. In some embodiments, such dimensions can facilitate specifying the impedance of the microwave transmission line to match that of the input and output coaxial lines (e.g., 50 Ohms in this case).

In the embodiment in FIG. 1A, signal layer sections 104a, 104b can comprise a cross-section view of signal lines 204. In the embodiment in FIG. 2B, signal layer sections 104a, 104b can comprise ground plane sections 205a, 205b, which are not connected to signal lines 204. In some embodiments, ground plane sections 205a, 205b can be coupled (e.g., electrically, physically, thermally, etc.) to first ground layer sections 102a, 102b and/or to second ground layer sections 106a, 106b by ground vias 202. In these embodiments, such coupling of first ground layer sections 102a, 102b to ground layer sections 205a, 205b and to second ground layer sections 106a, 106b by ground vias 202 can prevent one or more unwanted, spurious microwave modes and/or crosstalk. In some embodiments, ground vias 202 can be fabricated using materials including, but not limited to, copper, copper alloys (e.g., copper nickel), gold, platinum, palladium, gold alloys (e.g., gold palladium), brass, aluminum, or any conductive metal or alloy.

In some embodiments, layer 200c (FIG. 2C) can comprise a top view of an example, non-limiting alternative embodiment of first ground layer sections 102a, 102b of device 100a. In such embodiments, first ground layer sections 102a, 102b of device 200c can comprise one or more thermal decoupling devices 110 that can be coupled to first ground layer section 102a, signal layer section 104a, and signal layer section 104b as described above with reference to FIG. 1A. In the embodiment depicted in FIG. 2C, thermal decoupling devices 110 can be epoxied to extensions of first ground layer section 102a, which can extend underneath thermal decoupling devices 110 and into thermal barrier 108 region.

Figure 3:
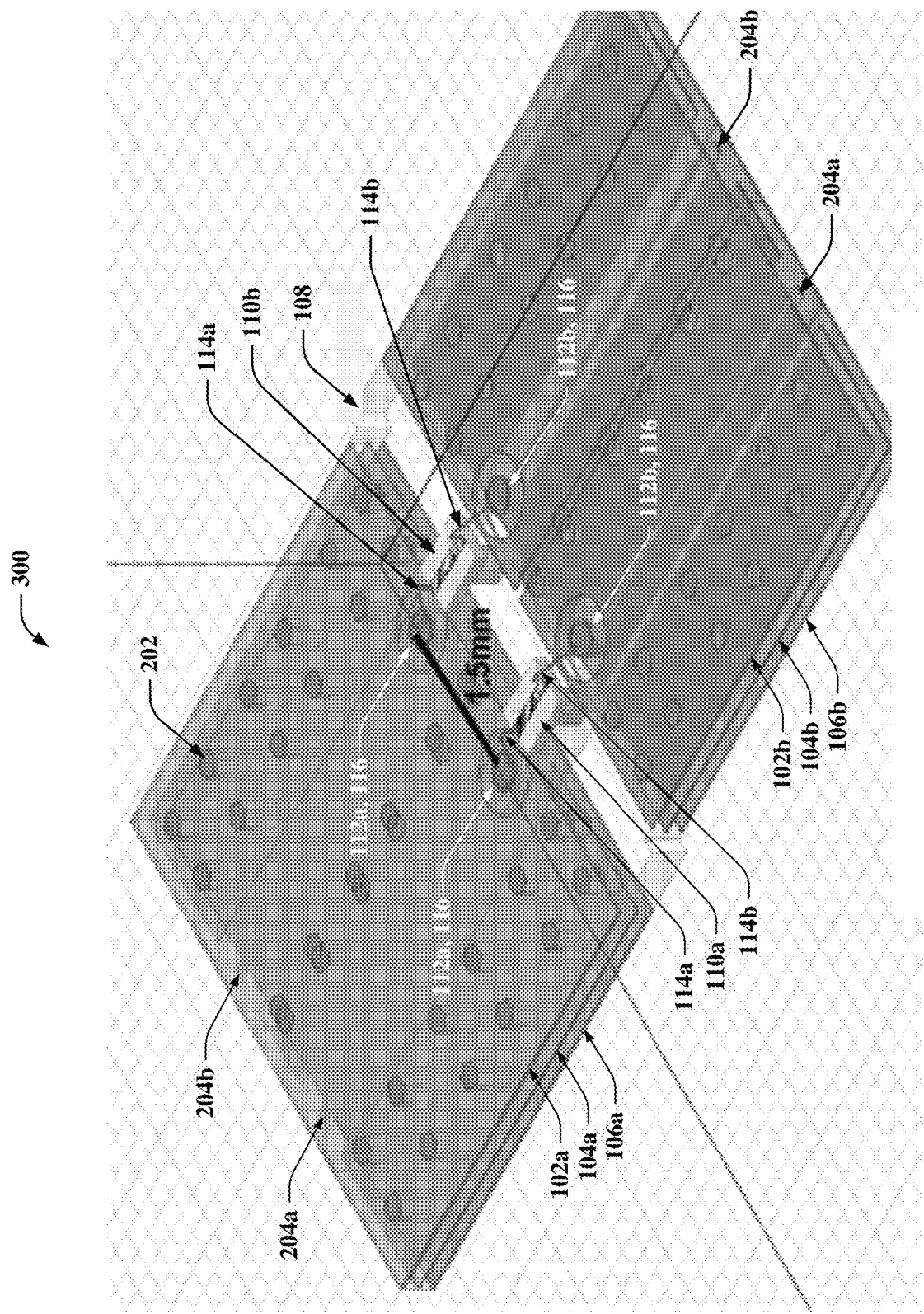
FIG. 3 illustrates an orthogonal view of an example, non-limiting device that can facilitate transmitting microwave signals to one or more cryogenic stages of a cryogenic refrigerator in accordance with one or more embodiments described herein.

FIG. 3 illustrates an orthogonal view of an example, non-limiting device 300 that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

According to multiple embodiments, device 300 can comprise an example, non-limiting alternative embodiment of device 100a. In such embodiments, device 300 can comprise one or more thermal decoupling devices 110a, 110b that can be coupled to first ground layer section 102a, signal layer section 104a, and signal layer section 104b as described above with reference to thermal decoupling device 110 and FIG. 1A. For example, device 300 can comprise thermal decoupling device 110a coupled to first ground layer section 102a, signal line 204a of signal layer section 104a, and signal line 204a of signal layer section 104b (e.g., as depicted in FIG. 3). In this example, device 300 can further comprise thermal decoupling device 110b coupled to first ground layer section 102a, signal line 204b of signal layer section 104a, and signal line 204b of signal layer section 104b (e.g., as depicted in FIG. 3).

For visual clarity, the example embodiment depicted in FIG. 3 does not include several components described above with reference to device 100a and illustrated in FIG. 1A. Specifically, the example embodiment depicted in FIG. 3 does not illustrate heat sink 118, cryogenic plate 120, and material 122. It should be appreciated that although the embodiment depicted in FIG. 3 illustrates at least two (2) vias 112a spaced 1.5 millimeters (mm) apart, the subject disclosure is not so limited. For instance, in some embodiments, vias 112a and/or vias 112b can be spaced apart from each other at a distance that is less than or greater than 1.5 mm.

Figure 4B:
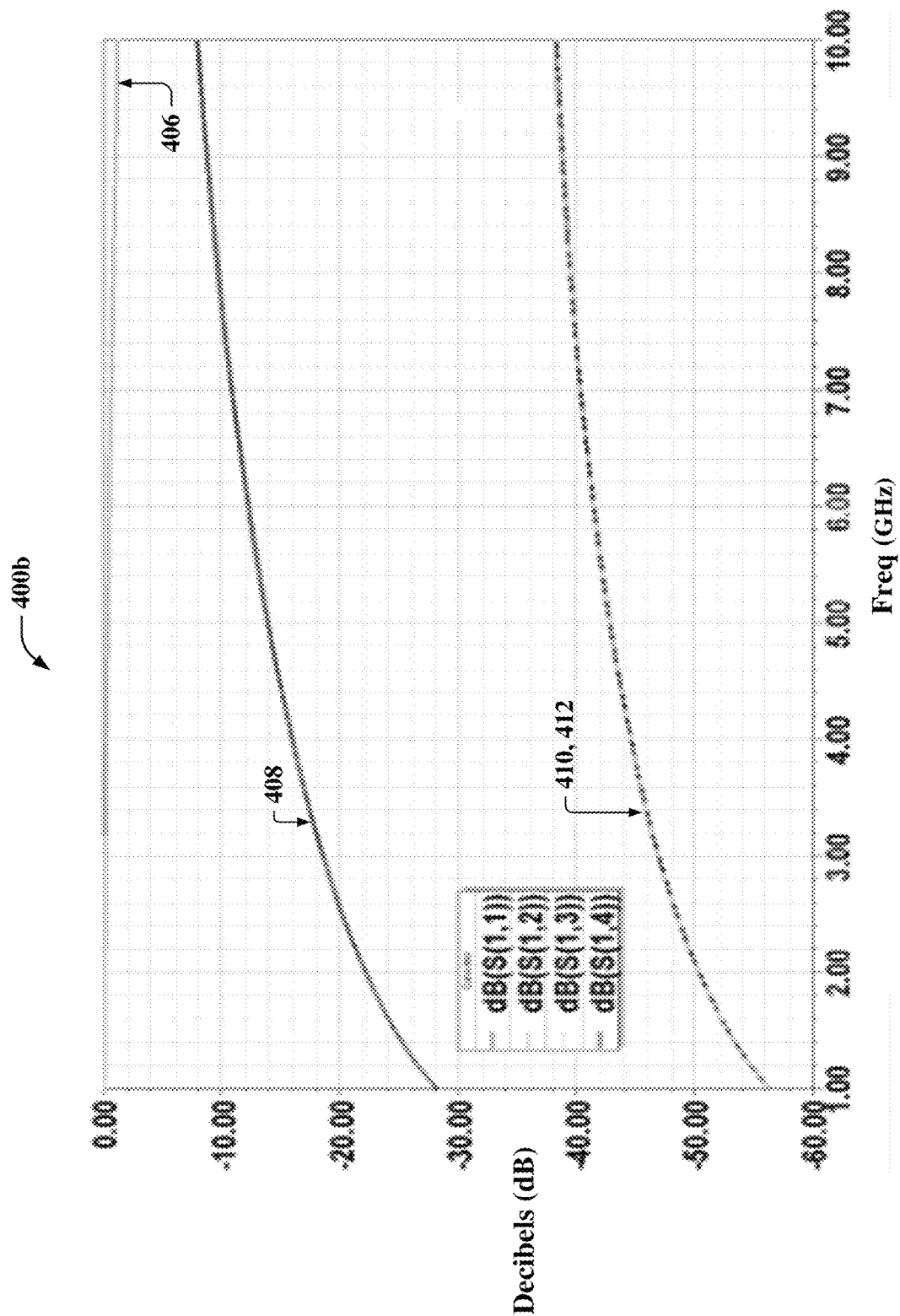

FIGS. 4A and 4B illustrate example, non-limiting graphs 400a, 400b that can represent data of microwave signals transmitted in accordance with one or more embodiments described herein. Repetitive description of like elements and/or processes employed in respective embodiments is omitted for sake of brevity. In some embodiments, graphs 400a and 400b can illustrate the effect of thermal barrier 108 on the microwave performance Hence, in some embodiments, in graphs 400a and 400b, the attenuation due to device 110a can be 0 decibels (dB) and the attenuation due to device 110b can similarly be 0 dB.

According to multiple embodiments, graphs 400a, 400b can comprise representations of data determined by implementing one or more embodiments of the subject disclosure. For example, graphs 400a, 400b can comprise representations of data determined by fabricating (e.g., as described above with reference to FIG. 1A) device 300 and simulating transmission of microwave signals through such fabricated device 300. In some embodiments, graphs 400a, 400b can comprise representations of data determined from performing a high frequency electromagnetic field simulation of microwave signals transmitted through such fabricated device 300.

In some embodiments, graph 400a (FIG. 4A) can comprise a representation of time-domain reflectometry (TDR) data determined from performing a high frequency electromagnetic field simulation of microwave signals transmitted through a fabricated device 300, where the y-axis can represent Ohms a and the x-axis can represent time in nanoseconds (ns). In some embodiments, graph 400a can comprise plot line 402 and/or plot line 404 that can represent time-domain reflectometry (TDR) data (e.g., impedance data) corresponding to one or more transmission lines of a simulated device 300. For example, plot line 402 and/or plot line 404 can represent impedance data corresponding to signal lines 204a, 204b of device 300. In this example, graph 400a, plot line 402, and/or plot line 404 can represent an impedance value of approximately 47Ω corresponding to signal lines 204a, 204b of device 300, which can vary only a few percent over the entire timespan, indicating the transition between transmission lines comprising signal line 204 and ground planes 102a, 102b, 205a, 205b, 106a, 106b, signal vias 112a, 112b, and wirebonds 114a, 114b is well-matched to coaxial input and output lines at 50 Ohms impedance.

In some embodiments, graph 400b (FIG. 4B) can comprise a representation of crosstalk data determined from performing a high frequency electromagnetic field simulation of microwave signals transmitted through a fabricated device 300, where the y-axis can represent decibels (dB) and the x-axis can represent frequency in gigahertz (GHz). In some embodiments, graph 400b can comprise plot line 406, plot line 408, plot line 410, and/or plot line 412 that can represent data corresponding to one or more components of a simulated device 300. For example, plot line 406 can represent transmission and plot line 408 can represent reflection. In another example, plot line 410 and/or plot line 412 can represent crosstalk that can occur between thermal decoupling device 110a and thermal decoupling device 110b of device 300 and/or crosstalk that can occur between electrically conductive components coupled to thermal decoupling devices 110a, 110b (e.g., signal vias 112a, 112b, wire bonds 114a, 114b, signal lines 204a, 204b, etc.). In this example, graph 400b, plot line 410, and/or plot line 412 can represent a crosstalk value of approximately −40 dB corresponding to device 300. In this example, such a crosstalk value of approximately −40 dB can occur at a frequency of approximately 5 GHz, a commonly used frequency for controlling superconducting qubits.

Figure 5:
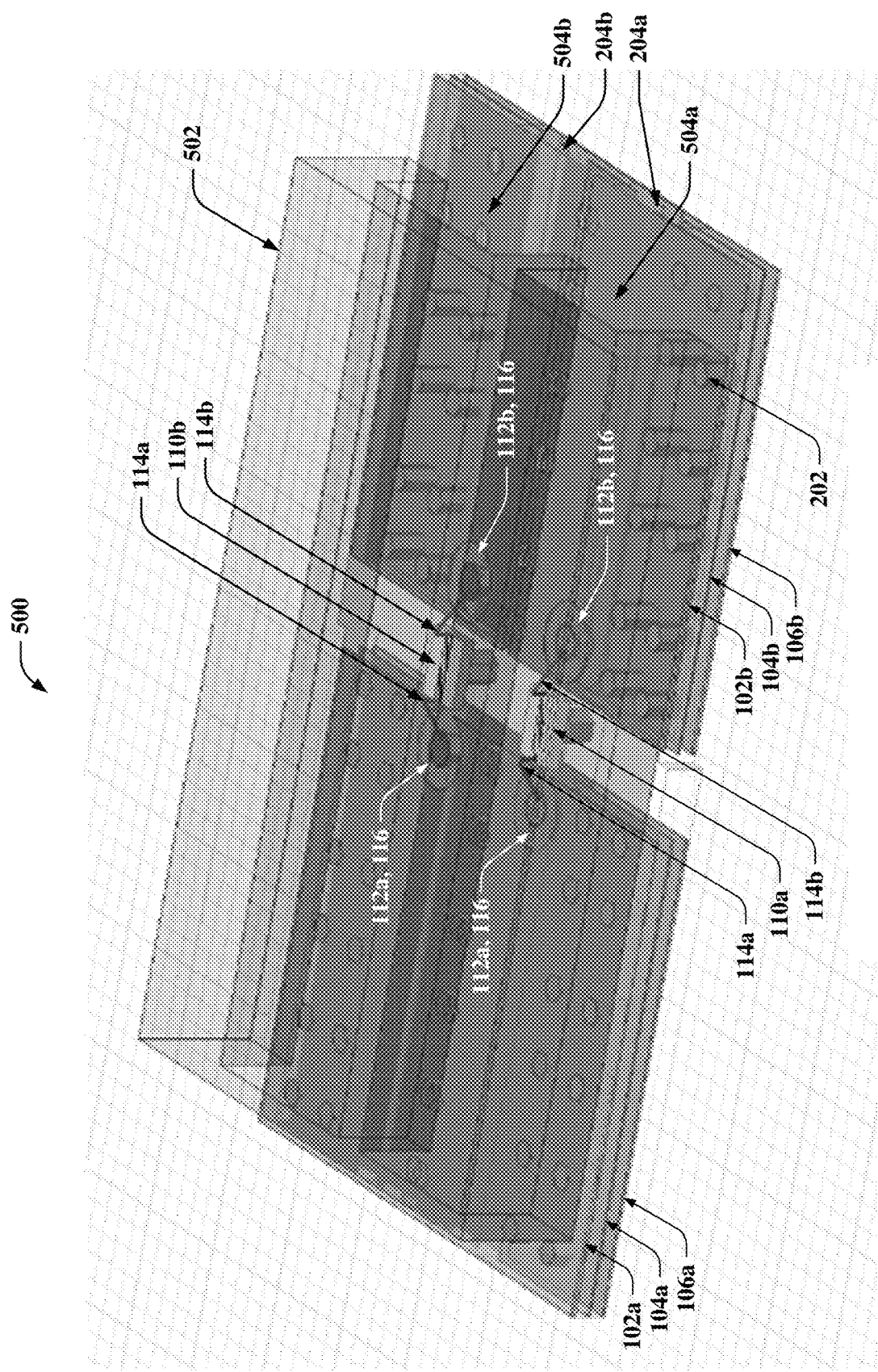
FIG. 5 illustrates an orthogonal view of an example, non-limiting device that can facilitate transmitting microwave signals to one or more cryogenic stages of a cryogenic refrigerator in accordance with one or more embodiments described herein.

FIG. 5 illustrates an orthogonal view of an example, non-limiting device 500 that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

According to multiple embodiments, device 500 can comprise an example, non-limiting alternative embodiment of device 300, where device 500 can comprise a shield 502 coupled to first ground layer sections 102a, 102b. For example, shield 502 can be coupled (e.g., electrically, mechanically, physically, thermally, etc.) to a surface (e.g., a top surface) of first ground layer section 102a and/or first ground layer section 102b.

In some embodiments, shield 502 can comprise one or more channels 504a, 504b that can be positioned over one or more thermal decoupling devices 110a, 110b. For example, as illustrated in FIG. 5, shield 502 can be coupled to first ground layer sections 102a, 102b such that channel 504a is positioned over thermal decoupling device 110a and channel 504b is positioned over thermal decoupling device 110b. In this example, based on such coupling of shield 502 to first ground layer sections 102a, 102b, channel 504a can electrically isolate electrically conductive components positioned in channel 504a from electrically conductive components positioned in channel 504b. For instance, channel 504a can electrically isolate thermal decoupling device 110a and/or the electrically conductive components coupled thereto (e.g., signal vias 112a, 112b, wire bonds 114a, 114b, signal line 204, etc.) from thermal decoupling device 110b and/or the electrically conductive components coupled thereto (e.g., signal vias 112a, 112b, wire bonds 114a, 114b, signal line 204, etc.) positioned in channel 504b. In this example, such electrical isolation of such electrically conductive components positioned in channels 504a, 504b can facilitate reduced crosstalk between such components.

In some embodiments, shield 502 can comprise a copper nickel shield, a stainless steel shield, a niobium shield, an aluminum shield, a superconducting shield, and/or another shield. In some embodiments, shield 502 can comprise a machined component that can be fabricated as part of device 500, using one or more of the techniques described above to fabricate an integrated circuit in a semiconductor device. In some embodiments, shield 502 can comprise a clamp component that can be fabricated separately from device 500 and coupled (e.g., electrically, mechanically, physically, thermally, etc.) to device 500 (e.g., to first ground layer sections 102a, 102b as described above). It should be appreciated that, based on such coupling of shield 502 to first ground layer sections 102a, 102b as described above, shield 502 can re-establish ground continuity (e.g., of first ground layer sections 102a, 102b) without thermal shorting.

Figure 6:
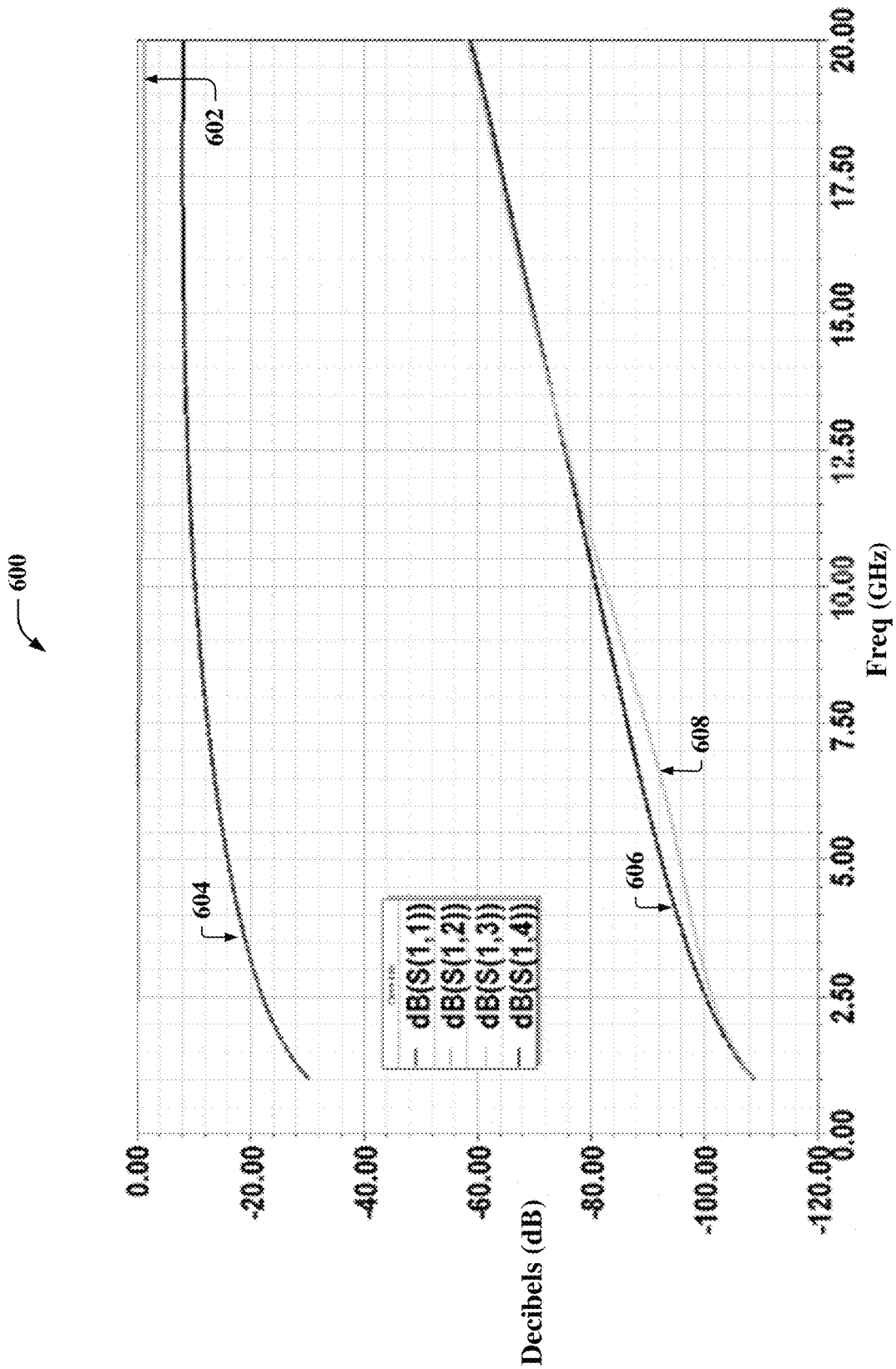
FIG. 6 illustrates an example, non-limiting graph 600 that can represent data of microwave signals transmitted in accordance with one or more embodiments described herein.

FIG. 6 illustrates an example, non-limiting graph 600 that can represent data of microwave signals transmitted in accordance with one or more embodiments described herein. Repetitive description of like elements and/or processes employed in respective embodiments is omitted for sake of brevity. In some embodiments, graph 600 can illustrate the effects of thermal barrier 108 and shield 502 on the microwave performance. Hence, in some embodiments, in graph 600, the attenuation due to device 110a can be 0 dB and the attenuation due to device 110b can similarly be 0 dB.

According to multiple embodiments, graph 600 can comprise a representation of data determined by implementing one or more embodiments of the subject disclosure. For example, graph 600 can comprise a representation of data determined by fabricating (e.g., as described above with reference to FIG. 1A) device 500 and simulating transmission of microwave signals through such fabricated device 500. For instance, graph 600 can comprise a representation of data determined from performing a high frequency electromagnetic field simulation of microwave signals transmitted through such fabricated device 500.

In some embodiments, graph 600 can comprise a representation of crosstalk data determined from performing a high frequency electromagnetic field simulation of microwave signals transmitted through a fabricated device 500, where the y-axis can represent decibels (dB) and the x-axis can represent frequency in gigahertz (GHz). In some embodiments, graph 600 can comprise plot line 602, plot line 604, plot line 606, and/or plot line 608 that can represent data corresponding to one or more components of a simulated device 500. For example, plot line 602 can represent transmission and plot line 604 can represent reflection. In another example, plot line 606 and/or plot line 608 can represent crosstalk that can occur between thermal decoupling device 110a and thermal decoupling device 110b of device 500 and/or crosstalk that can occur between electrically conductive components coupled to thermal decoupling devices 110a, 110b (e.g., signal vias 112a, 112b, wire bonds 114*a*, 114*b*, signal lines 204*a*, 204*b*, etc.). In this example, graph 600, plot line 606, and/or plot line 608 can represent a crosstalk value of approximately −90 dB corresponding to device 500. In this example, such a crosstalk value of approximately −90 dB can occur at a frequency of approximately 5 GHz, a commonly used frequency for controlling superconducting qubits.

Figure 7:
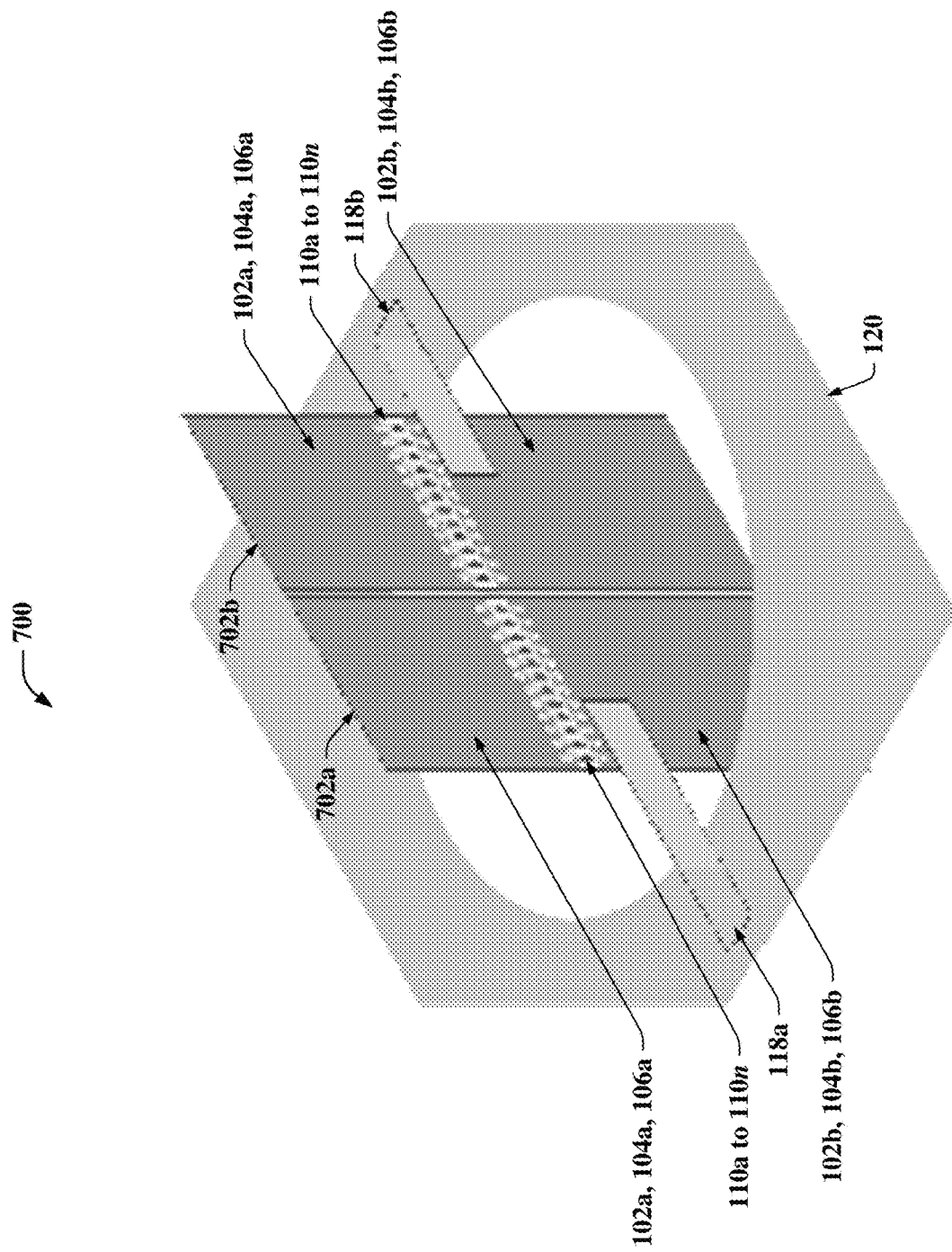
FIG. 7 illustrates an orthogonal view of an example, non-limiting system that can facilitate transmitting microwave signals to one or more cryogenic stages of a cryogenic refrigerator in accordance with one or more embodiments described herein.

FIG. 7 illustrates an orthogonal view of an example, non-limiting system 700 that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

According to multiple embodiments, system 700 can comprise one or more monolithic signal carrier devices 702*a*, 702*b* coupled to one or more cryogenic plates 120 of a cryogenic refrigerator via one or more heat sinks 118*a*, 118*b*. In some embodiments, monolithic signal carrier devices 702*a*, 702*b* can comprise example, non-limiting alternative embodiments of device 100*a*, device 100*b*, device 200*a*, device 200*b*, device 200*c*, and/or device 300. For example, monolithic signal carrier devices 702*a*, 702*b* can comprise example, non-limiting alternative embodiments of device 300, where each monolithic signal carrier device 702*a*, 702*b* can comprise one or more thermal decoupling devices 110*a*, 110*n* (n represents a total quantity of thermal decoupling devices 110) coupled to first ground layer section 102*a*, signal layer section 104*a*, and signal layer section 104*b* as described above with reference to thermal decoupling device 110 and FIG. 1A.

Figure 8:
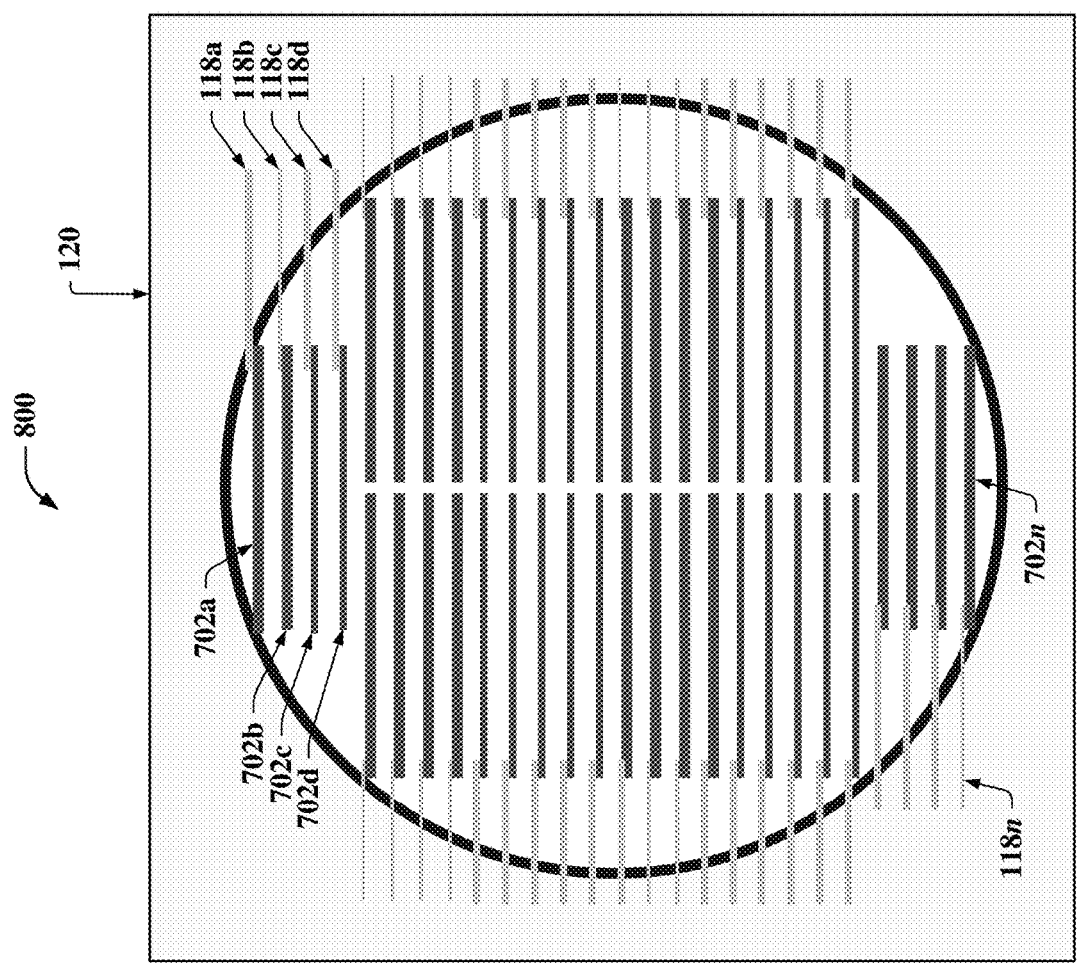
FIG. 8 illustrates a top view of an example, non-limiting system that can facilitate transmitting microwave signals to one or more cryogenic stages of a cryogenic refrigerator in accordance with one or more embodiments described herein.

FIG. 8 illustrates a top view of an example, non-limiting system 800 that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

According to multiple embodiments, system 800 can comprise an example, non-limiting alternative embodiment of system 700, where system 800 can comprise a plurality of monolithic signal carrier devices 702*a*, 702*b*, 702*c*, 702*d*, 702*n* (n represents a total quantity of monolithic signal carrier devices 702). In some embodiments, system 800 can comprise such a plurality of monolithic signal carrier devices 702*a*, 702*b*, 702*c*, 702*d*, 702*n* coupled to one or more cryogenic plates 120 of a cryogenic refrigerator via a plurality of heat sinks 118*a*, 118*b*, 118*c*, 118*d*, 118*n* (n represents a total quantity of heat sinks 118).

Figure 9:
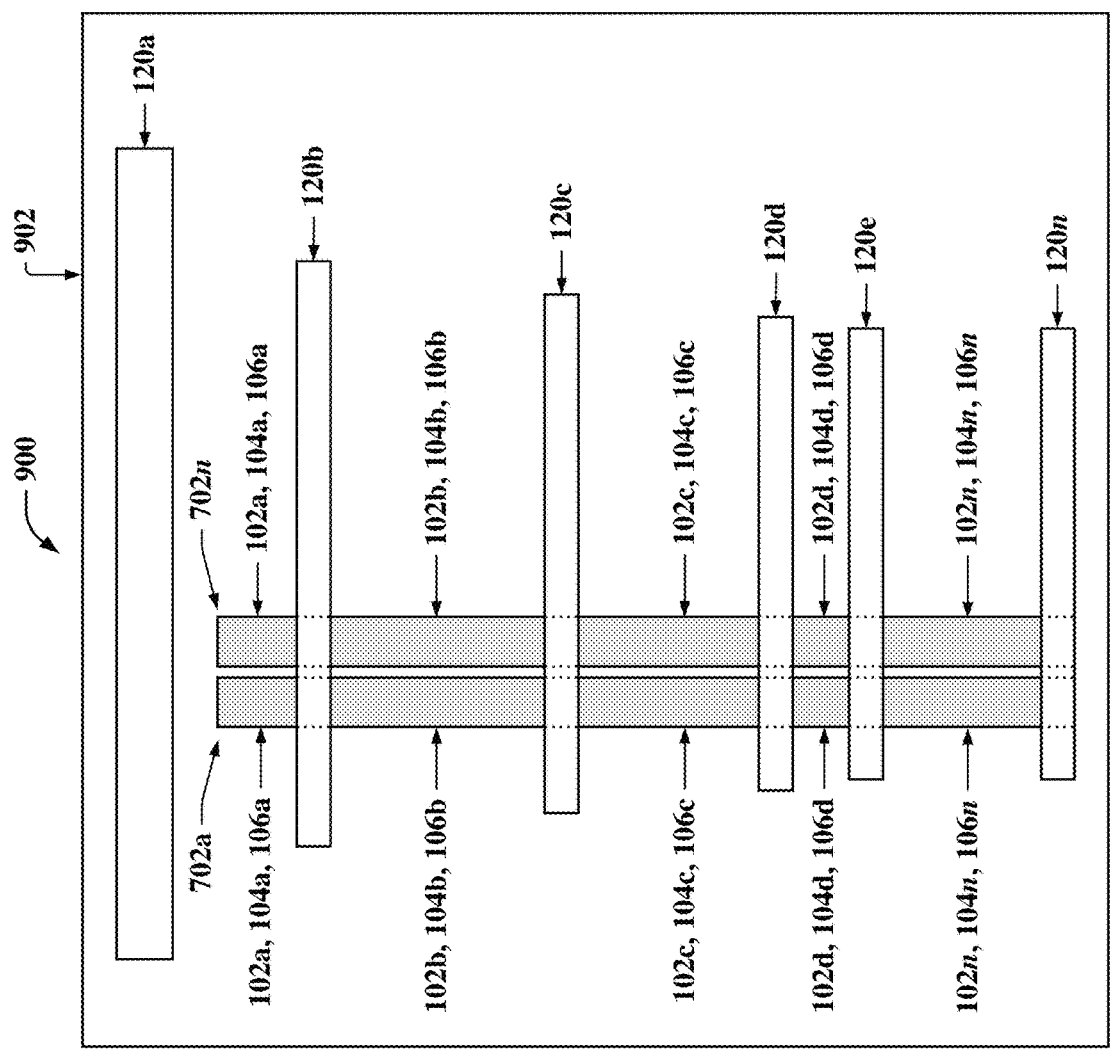
FIG. 9 illustrates a side view of an example, non-limiting system that can facilitate transmitting microwave signals to one or more cryogenic stages of a cryogenic refrigerator in accordance with one or more embodiments described herein.

FIG. 9 illustrates a side view of an example, non-limiting system 900 that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

According to multiple embodiments, system 900 can comprise an example, non-limiting alternative embodiment of system 700 and/or system 800. In some embodiments, system 900 can comprise a cryogenic refrigerator 902. In some embodiments, cryogenic refrigerator 902 can comprise a dilution refrigerator. In some embodiments, system 900 can comprise one or more monolithic signal carrier devices 702*a*, 702*n* (n represents a total quantity of monolithic signal carrier devices 702) that can extend through one or more cryogenic stages of cryogenic refrigerator 902. For example, as illustrated in FIG. 9, monolithic signal carrier devices 702*a*, 702*n* of system 900 can extend through one or more cryogenic plates 120*a*, 120*b*, 120*c*, 120*d*, 120*e*, 120*n* (n represents a total quantity of cryogenic plates 120) of cryogenic refrigerator 902.

In some embodiments, monolithic signal carrier devices 702*a*, 702*n* of system 900 can comprise one or more ground layer sections and/or one or more signal layer sections, where such ground layer sections and/or signal layer sections can be separated by one or more thermal barriers. For example, monolithic signal carrier devices 702*a*, 702*n* of system 900 can comprise one or more first ground layer sections 102*a*, 102*b*, 102*c*, 102*d*, 102*n* (n represents a total quantity of first ground layer sections 102) and/or one or more signal layer sections 104*a*, 104*b*, 104*c*, 104*d*, 104*n* (n represents a total quantity of signal layer sections 104), where such first ground layer sections 102*a*, 102*b*, 102*c*, 102*d*, 102*n* and/or signal layer sections 104*a*, 104*b*, 104*c*, 104*d*, 104*n* can be separated by one or more thermal barriers 108 (not illustrated in FIG. 9).

In some embodiments, monolithic signal carrier devices 702*a*, 702*n* of system 900 can comprise one or more thermal decoupling devices coupled at the thermal barriers to the sections of the ground layer and/or the sections of the signal layer, where the thermal decoupling devices can thermalize the sections of the ground layer and the sections of the signal layer. For example, monolithic signal carrier devices 702*a*, 702*n* of system 900 can comprise one or more thermal decoupling devices 110 (not illustrated in FIG. 9) coupled at thermal barriers 108 to first ground layer sections 102*a*, 102*b*, 102*c*, 102*d*, 102*n* and/or signal layer sections 104*a*, 104*b*, 104*c*, 104*d*, 104*n*, where such thermal decoupling devices 110 can thermalize first ground layer sections 102*a*, 102*b*, 102*c*, 102*d*, 102*n* and signal layer sections 104*a*, 104*b*, 104*c*, 104*d*, 104*n* (e.g., as described above with reference to FIG. 1A).

In some embodiments, one or more monolithic signal carrier devices 702*a*, 702*n* of system 900 can be coupled to one or more cryogenic plates 120*a*, 120*b*, 120*c*, 120*d*, 120*e*, 120*n* of cryogenic refrigerator 902. For example, monolithic signal carrier devices 702*a*, 702*n* of system 900 can be coupled (e.g., electrically, mechanically, physically, thermally, etc.) to cryogenic plates 120*a*, 120*b*, 120*c*, 120*d*, 120*e*, 120*n* via one or more heat sinks such as, for example, heat sinks 118 (not illustrated in FIG. 9). In some embodiments, first ground layer sections 102*a*, 102*b*, 102*c*, 102*d*, 102*n* can be coupled to cryogenic plates 120*a*, 120*b*, 120*c*, 120*d*, 120*e*, 120*n* by heat sinks 118 that can thermally couple such first ground layer sections 102*a*, 102*b*, 102*c*, 102*d*, 102*n* to cryogenic plates 120*a*, 120*b*, 120*c*, 120*d*, 120*e*, 120*n*. In these embodiments, thermal barriers 108 of monolithic signal carrier devices 702*a*, 702*n* can separate first ground layer sections 102*a*, 102*b*, 102*c*, 102*d*, 102*n* that can be thermally coupled to cryogenic plates 120*a*, 120*b*, 120*c*, 120*d*, 120*e*, 120*n* via heat sinks 118 as described above. In some embodiments, thermal barriers 108 can thermally separate each of such first ground layer sections 102*a*, 102*b*, 102*c*, 102*d*, 102*n* that can extend through cryogenic plates 120*a*, 120*b*, 120*c*, 120*d*, 120*e*, 120*n*.

In some embodiments, cryogenic plate 120*n* of cryogenic refrigerator 902 can comprise a mixing chamber stage having one or more quantum computing devices (e.g., a quantum computer, quantum processor, quantum hardware, quantum circuit, etc.). In these embodiments, monolithic signal carrier devices 702*a*, 702*n* of system 900 can be coupled (e.g., electrically, mechanically, operatively, physically, etc.) to such quantum computing device(s) such that monolithic signal carrier devices 702*a*, 702*n* can facilitate transmitting (e.g., via a vector network analyzer (VNA)) microwave signals to such quantum computing device(s). For example, one or more signal lines 204 of monolithic signal carrier devices 702a, 702n (not illustrated in FIG. 9) can be coupled (e.g., electrically, mechanically, operatively, physically, etc.) to such quantum computing device(s) such that monolithic signal carrier devices 702a, 702n and/or signal lines 204 can facilitate transmitting (e.g., via a vector network analyzer (VNA)) microwave signals to such quantum computing device(s).

In some embodiments, the monolithic signal carrier device of the subject disclosure (e.g., device 100a, device 100b, device 300, device 500, monolithic signal carrier devices 702a, 702b, 702c, 702d, 702n, etc.) can be a monolithic signal carrier device associated with various technologies. For example, the monolithic signal carrier device of the subject disclosure (e.g., device 100a, device 100b, device 300, device 500, monolithic signal carrier devices 702a, 702b, 702c, 702d, 702n, etc.) can be associated with cryogenic technologies, cryogenic refrigerator technologies, microwave signal carrier technologies, monolithic signal carrier device technologies, semiconductor fabrication technologies, printed circuit board technologies, quantum computing device technologies, quantum circuit technologies, quantum bit (qubit) technologies, circuit quantum electrodynamics (circuit-QED) technologies, quantum computing technologies, scalable quantum computing architecture technologies, surface code architecture technologies, surface code error correction architecture technologies, quantum hardware technologies, and/or other technologies.

In some embodiments, the monolithic signal carrier device of the subject disclosure (e.g., device 100a, device 100b, device 300, device 500, monolithic signal carrier devices 702a, 702b, 702c, 702d, 702n, etc.) can provide technical improvements to systems, devices, components, operational steps, and/or processing steps associated with the various technologies identified above. For example, the monolithic signal carrier device of the subject disclosure (e.g., device 100a, device 100b, device 300, device 500, monolithic signal carrier devices 702a, 702b, 702c, 702d, 702n, etc.) can provide a large quantity (e.g., approximately 1,000 or more) of independent microwave signal transmission paths (e.g., signal layer sections 104a, 104b, 104c, 104d, 104n, signal lines 204a, 204b, etc.) that can be utilized to transmit independent microwave signals to respective quantum computing devices and/or qubits in a mixing chamber stage of a cryogenic refrigerator. In another example, the monolithic signal carrier device of the subject disclosure (e.g., device 100a, device 100b, device 300, device 500, monolithic signal carrier devices 702a, 702b, 702c, 702d, 702n, etc.) can extend through multiple stages of a cryogenic refrigerator without utilizing several components employed in state-of-the-art systems (e.g., subminiature version A (SMA) bulkheads, coaxial cables, etc.), thereby eliminating a need for such components. In another example, the monolithic signal carrier device of the subject disclosure (e.g., device 100a, device 100b, device 300, device 500, monolithic signal carrier devices 702a, 702b, 702c, 702d, 702n, etc.) can be coupled to one or more cryogenic plates of a cryogenic refrigerator by a flexible heat sink, which can allow the monolithic signal carrier device of the subject disclosure, as well as the cryogenic plate(s) to expand and contract independently due to the varying temperatures of each cryogenic stage of the cryogenic refrigerator.

In some embodiments, the monolithic signal carrier device of the subject disclosure (e.g., device 100a, device 100b, device 300, device 500, monolithic signal carrier devices 702a, 702b, 702c, 702d, 702n, etc.) can provide technical improvements to a processing unit associated with a quantum computing device (e.g., a quantum processor, quantum hardware etc.), a circuit-QED system, and/or a superconducting quantum circuit. For example, as described above, the monolithic signal carrier device of the subject disclosure (e.g., device 100a, device 100b, device 300, device 500, monolithic signal carrier devices 702a, 702b, 702c, 702d, 702n, etc.) can provide an increased quantity of independent microwave signal transmission paths (signal layer sections 104a, 104b, 104c, 104d, 104n, signal lines 204a, 204b, etc.) that can be utilized to transmit microwave signals to respective quantum computing devices in a mixing chamber stage of a cryogenic refrigerator. In this example, such quantum computing devices can comprise a quantum processor, and by providing an increased quantity of independent microwave signals that can be transmitted to such quantum processor, the monolithic signal carrier device of the subject disclosure can facilitate improved performance of such a quantum processor (e.g., improved error correction, improved processing time, etc.).

In some embodiments, the monolithic signal carrier device of the subject disclosure (e.g., device 100a, device 100b, device 300, device 500, monolithic signal carrier devices 702a, 702b, 702c, 702d, 702n, etc.) can employ hardware and/or software to solve problems that are highly technical in nature, that are not abstract and that cannot be performed as a set of mental acts by a human. For example, the monolithic signal carrier device of the subject disclosure (e.g., device 100a, device 100b, device 300, device 500, monolithic signal carrier devices 702a, 702b, 702c, 702d, 702n, etc.) can facilitate transmitting microwave signals to a quantum computing device in a mixing chamber stage of a cryogenic refrigerator.

It is to be appreciated that the monolithic signal carrier device of the subject disclosure (e.g., device 100a, device 100b, device 300, device 500, monolithic signal carrier devices 702a, 702b, 702c, 702d, 702n, etc.) can utilize various combinations of electrical components, mechanical components, and circuitry that cannot be replicated in the mind of a human or performed by a human. For example, transmitting microwave signals to one or more cryogenic stages of the cryogenic refrigerator is an operation that is greater than the capability of a human mind. For instance, the amount of data transmitted, the speed of transmitting such data, and/or the types of data transmitted by the monolithic signal carrier device of the subject disclosure over a certain period of time can be greater, faster, and/or different than the amount, speed, and/or data type that can be transmitted by a human mind over the same period of time.

In some embodiments, the monolithic signal carrier device of the subject disclosure (e.g., device 100a, device 100b, device 300, device 500, monolithic signal carrier devices 702a, 702b, 702c, 702d, 702n, etc.) can also be fully operational towards performing one or more other functions (e.g., fully powered on, fully executed, etc.) while also performing the above-referenced microwave signals transmission process. It should be appreciated that such simultaneous multi-operational execution is beyond the capability of a human mind. It should also be appreciated that the monolithic signal carrier device of the subject disclosure can include information that is impossible to obtain manually by an entity, such as a human user. For example, the type, amount, and/or variety of information that can be transmitted via one or more of the monolithic signal carrier device embodiments described herein can be more complex than information obtained manually by a human user.

Figure 10:
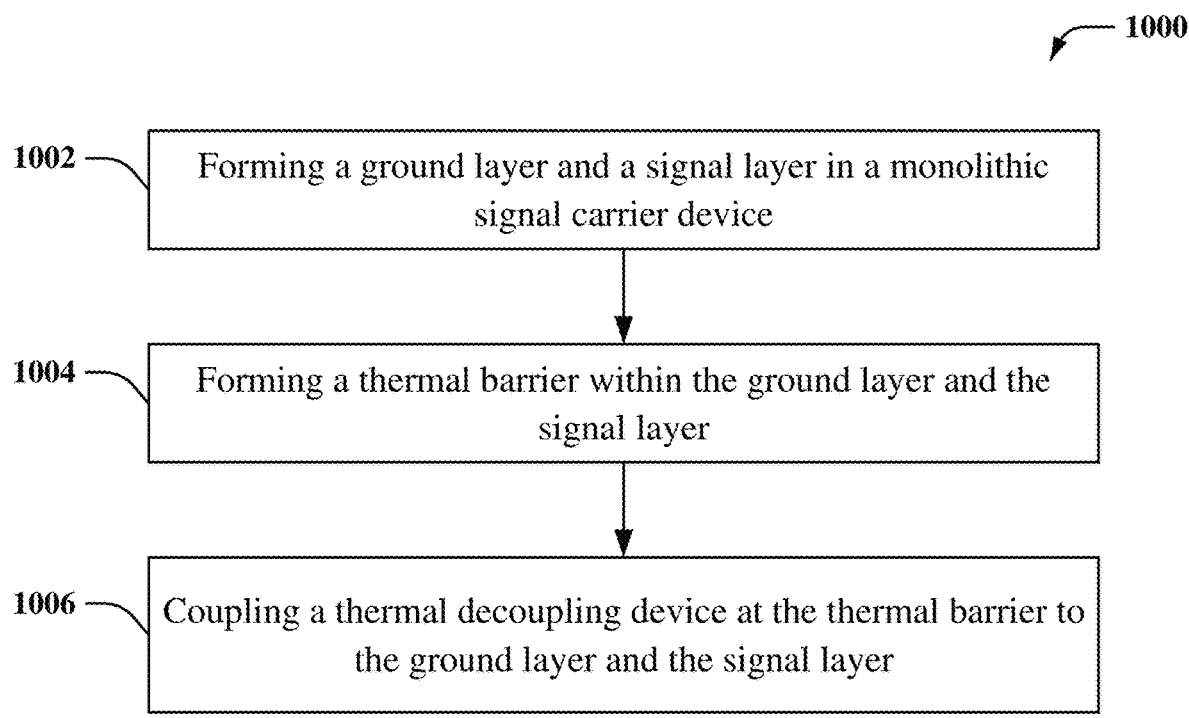
FIG. 10 illustrates a flow diagram of an example, non-limiting computer-implemented method that can facilitate transmitting microwave signals to one or more cryogenic stages of a cryogenic refrigerator in accordance with one or more embodiments described herein.

FIG. 10 illustrates a flow diagram of an example, non-limiting computer-implemented method 1000 that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

In some embodiments, method 1000 can be implemented by a computing system (e.g., operating environment 1200 illustrated in FIG. 12 and described below) and/or a computing device (e.g., computer 1212 illustrated in FIG. 12 and described below). In non-limiting example embodiments, such computing system (e.g., operating environment 1200) and/or such computing device (e.g., computer 1212) can comprise one or more processors and one or more memory devices that can store executable instructions thereon that, when executed by the one or more processors, can facilitate performance of the operations described herein, including the non-limiting operations of method 1000 illustrated in FIG. 10. As a non-limiting example, the one or more processors can facilitate performance of the operations described herein, for example, method 1000, by directing and/or controlling one or more systems and/or equipment operable to perform semiconductor fabrication (e.g., fabrication of an integrated circuit in a semiconductor device).

At 1002, forming (e.g., via computer 1212) a ground layer (e.g., the first ground layer of device 100a and/or first ground layer sections 102a, 102b) and a signal layer (e.g., the signal layer of device 100a and/or signal layer sections 104a, 104b) in a monolithic signal carrier device (e.g., device 100a, device 100b, device 300, device 500, etc.). At 1004, forming (e.g., via computer 1212) a thermal barrier (e.g., thermal barrier 108) within the ground layer and the signal layer. At 1006, coupling (e.g., via computer 1212) a thermal decoupling device (e.g., thermal decoupling device 110) at the thermal barrier to the ground layer (e.g., to first ground layer section 102a) and the signal layer (e.g., to signal layer sections 104a, 104b). In some embodiments, such forming and/or coupling steps of operations 1002, 1004, and/or 1006 can be performed (e.g., via computer 1212) using one or more techniques to fabricate an integrated circuit in a semiconducting device (e.g., as described above with reference to FIG. 1A).

Figure 11:
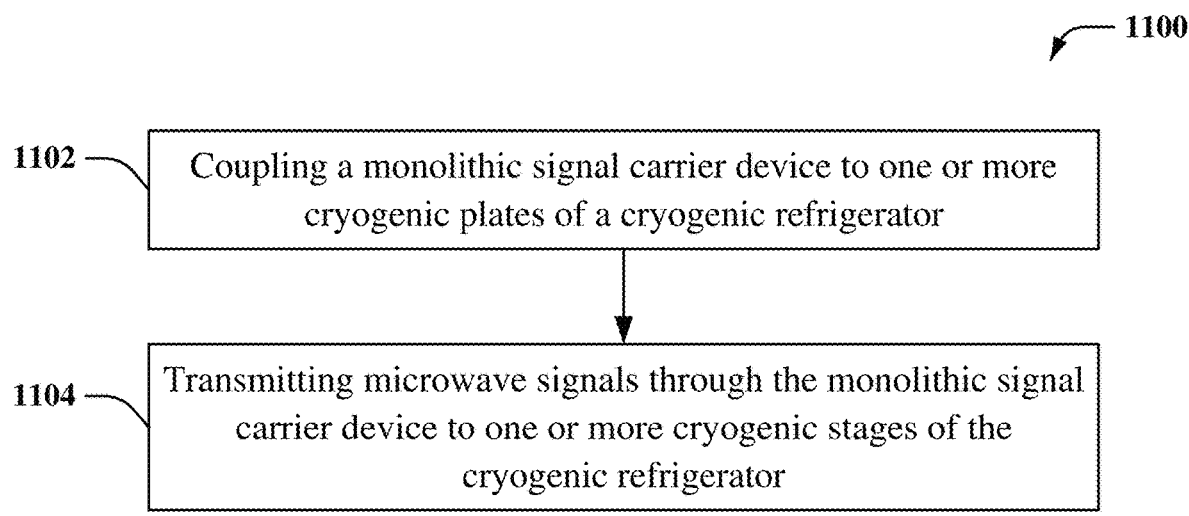
FIG. 11 illustrates a flow diagram of an example, non-limiting computer-implemented method that can facilitate transmitting microwave signals to one or more cryogenic stages of a cryogenic refrigerator in accordance with one or more embodiments described herein.

FIG. 11 illustrates a flow diagram of an example, non-limiting computer-implemented method 1100 that can facilitate transmitting microwave signals to one or more cryogenic stages of a cryogenic refrigerator in accordance with one or more embodiments described herein. Repetitive description of like elements and/or processes employed in respective embodiments is omitted for sake of brevity.

In some embodiments, method 1100 can be implemented by a computing system (e.g., operating environment 1200 illustrated in FIG. 12 and described below) and/or a computing device (e.g., computer 1212 illustrated in FIG. 12 and described below). In non-limiting example embodiments, such computing system (e.g., operating environment 1200) and/or such computing device (e.g., computer 1212) can comprise one or more processors and one or more memory devices that can store executable instructions thereon that, when executed by the one or more processors, can facilitate performance of the operations described herein, including the non-limiting operations of method 1100 illustrated in FIG. 11. As a non-limiting example, the one or more processors can facilitate performance of the operations described herein, for example, method 1100, by directing and/or controlling one or more systems and/or equipment operable to perform such operations (e.g., a vector network analyzer (VNA)).

At 1102, coupling (e.g., via heat sink 118, heat sinks 118a, 118b, 118c, 118d, 118n, etc.) a monolithic signal carrier device (e.g., device 100a, device 100b, device 300, device 500, monolithic signal carrier devices 702a, 702b, 702c, 702d, 702n, etc.) to one or more cryogenic plates (e.g., cryogenic plate 120, cryogenic plates 120a, 120b, 120c, 120d, 120e, 120n, etc.) of a cryogenic refrigerator (e.g., cryogenic refrigerator 902). At 1104, transmitting (e.g., via computer 1212 and/or a vector network analyzer (VNA) as described above with reference to FIG. 1A) microwave signals through the monolithic signal carrier device to one or more cryogenic stages (e.g., a mixing chamber) of the cryogenic refrigerator.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 12:
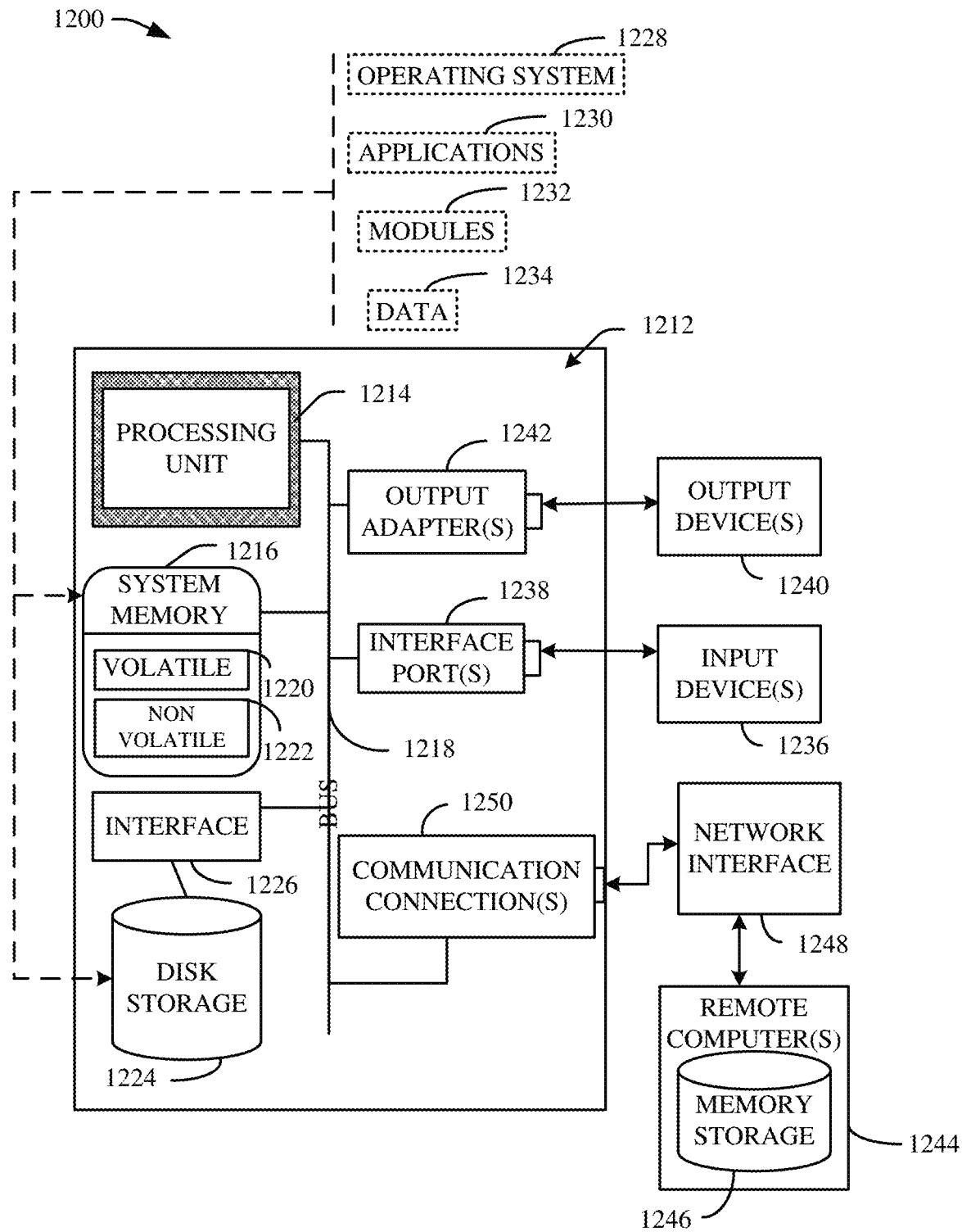
FIG. 12 illustrates a block diagram of an example, non-limiting operating environment in which one or more embodiments described herein can be facilitated.

In order to provide a context for the various aspects of the disclosed subject matter, FIG. 12 as well as the following discussion are intended to provide a general description of a suitable environment in which the various aspects of the disclosed subject matter can be implemented. FIG. 12 illustrates a block diagram of an example, non-limiting operating environment in which one or more embodiments described herein can be facilitated. Repetitive description of like elements employed in other embodiments described herein is omitted for sake of brevity.

With reference to FIG. 12, a suitable operating environment 1200 for implementing various aspects of this disclosure can also include a computer 1212. The computer 1212 can also include a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214. The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1216 can also include volatile memory 1220 and nonvolatile memory 1222. The basic input/output system (BIOS), containing the basic routines to transfer information between elements within the computer 1212, such as during start-up, is stored in nonvolatile memory 1222. Computer 1212 can also include removable/non-removable, volatile/non-volatile computer storage media. FIG. 12 illustrates, for example, a disk storage 1224. Disk storage 1224 can also include, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media. To facilitate connection of the disk storage 1224 to the system bus 1218, a removable or non-removable interface is typically used, such as interface 1226. FIG. 12 also depicts software that acts as an intermediary between users and the basic computer resources described in the suitable operating environment 1200. Such software can also include, for example, an operating system 1228. Operating system 1228, which can be stored on disk storage 1224, acts to control and allocate resources of the computer 1212.

System applications 1230 take advantage of the management of resources by operating system 1228 through program modules 1232 and program data 1234, e.g., stored either in system memory 1216 or on disk storage 1224. It is to be appreciated that this disclosure can be implemented with various operating systems or combinations of operating systems. A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port can be used to provide input to computer 1212, and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a computer, a server, a router, a network PC, a workstation, a microprocessor based appliance, a peer device or other common network node and the like, and typically can also include many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1250 refers to the hardware/software employed to connect the network interface 1248 to the system bus 1218. While communication connection 1250 is shown for illustrative clarity inside computer 1212, it can also be external to computer 1212. The hardware/software for connection to the network interface 1248 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a monolithic signal carrier device comprising a thermal barrier disposed within a ground layer and a signal layer;
   a thermal decoupling device coupled at the thermal barrier to the ground layer and the signal layer; and
   a heat sink coupled to the ground layer and a cryogenic plate of a cryogenic refrigerator, wherein the heat sink thermalizes the ground layer and the cryogenic plate.

2. The device of claim 1, wherein the monolithic signal carrier device further comprises a second ground layer coupled to the ground layer.

3. The device of claim 1, wherein the thermal decoupling device thermalizes the ground layer and the signal layer.

4. The device of claim 1, wherein the signal layer comprises one or more stripline microwave transmission lines.

5. The device of claim 1, wherein the heat sink comprises a flexible heat sink.

6. The device of claim 1, wherein the heat sink comprises at least one of a thermally conductive heat sink or an electrically conductive heat sink.

7. The device of claim 1, wherein the monolithic signal carrier device comprises a monolithic dielectric circuit board or a monolithic organic laminate circuit board.

8. The device of claim 1, wherein the thermal decoupling device is thermally coupled to the ground layer.

9. The device of claim 1, wherein the thermal decoupling device is electrically coupled to the signal layer by at least one of a wire bond or a via.

10. A method, comprising:
    forming a ground layer and a signal layer in a monolithic signal carrier device;

forming a thermal barrier within the ground layer and the signal layer;

coupling a thermal decoupling device at the thermal barrier to the ground layer and the signal layer; and coupling a heat sink to the ground layer and a cryogenic plate of a cryogenic refrigerator.

11. The method of claim 10, further comprising:

forming a second ground layer in the monolithic signal carrier device; and coupling the second ground layer to the ground layer.

12. The method of claim 10, wherein the coupling comprises:

thermally coupling the thermal decoupling device at the thermal barrier to the ground layer; and electrically coupling the thermal decoupling device at the thermal barrier to the signal layer.

13. The method of claim 10, further comprising coupling a shield to the ground layer.

14. A device, comprising:

a monolithic signal carrier device comprising thermal barriers disposed within a ground layer and a signal layer;

thermal decoupling devices coupled at the thermal barriers to the ground layer and the signal layer;

a shield coupled to the ground layer; and heat sinks coupled to the ground layer and cryogenic plates of a cryogenic refrigerator, wherein the heat sinks thermally couple the ground layer to the cryogenic plates, and wherein the thermal barriers separate sections of the ground layer that are thermally coupled to different cryogenic plates.

15. The device of claim 14, wherein the shield electrically isolates the thermal decoupling devices, thereby facilitating reduced crosstalk between at least one of: the thermal decoupling devices; one or more wire bonds that couple the thermal decoupling devices to the signal layer; or multiple stripline microwave transmission lines of the signal layer.

16. The device of claim 14, wherein the shield is selected from a group consisting of a copper nickel shield, a stainless steel shield, a niobium shield, an aluminum shield, and a superconducting shield.

17. A system, comprising:

a cryogenic refrigerator comprising cryogenic plates that separate cryogenic stages; and a monolithic signal carrier device coupled to the cryogenic plates that transmits microwave signals across the cryogenic stages to a mixing chamber stage of the cryogenic refrigerator, wherein the monolithic signal carrier device comprises a ground layer, a signal layer, and thermal barriers disposed within the ground layer and the signal layer, and wherein the ground layer is coupled to the cryogenic plates by heat sinks that thermally couple the ground layer to the cryogenic plates, and wherein the thermal barriers separate sections of the ground layer that are thermally coupled to the cryogenic plates.

18. The system of claim 17, further comprising thermal decoupling devices coupled at the thermal barriers to the ground layer and the signal layer, wherein the thermal decoupling devices thermalize the ground layer and the signal layer.

19. A method, comprising:

coupling a monolithic signal carrier device to one or more cryogenic plates of a cryogenic refrigerator; and transmitting microwave signals through the monolithic signal carrier device to one or more cryogenic stages of the cryogenic refrigerator, wherein the monolithic signal carrier device comprises a ground layer, a signal layer, and thermal barriers disposed within the ground layer and the signal layer, and wherein the ground layer is coupled to the one or more cryogenic plates by heat sinks that thermally couple the ground layer to the one or more cryogenic plates, and wherein the thermal barriers separate sections of the ground layer that are thermally coupled to the one or more cryogenic plates.

20. The method of claim 19, further comprising:

thermalizing the ground layer of the monolithic signal carrier device and the one or more cryogenic plates; and thermalizing the ground layer and the signal layer of the monolithic signal carrier device.

\* \* \* \* \*